(12) United States Patent
Vigilante et al.

(10) Patent No.: US 10,784,636 B1
(45) Date of Patent: Sep. 22, 2020

(54) ASYMMETRICAL QUADRATURE HYBRID COUPLER

(71) Applicant: Qualcomm Incorporated, San Diego, CA (US)

(72) Inventors: Marco Vigilante, San Diego, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/600,877

(22) Filed: Oct. 14, 2019

(51) Int. Cl.
  *H04B 1/40* (2015.01)
  *H01P 5/12* (2006.01)
  *H03F 3/19* (2006.01)
  *H01R 31/00* (2006.01)
  *H01R 13/66* (2006.01)

(52) U.S. Cl.
  CPC ....... *H01R 31/005* (2013.01); *H01R 13/6633* (2013.01); *H04B 1/40* (2013.01)

(58) Field of Classification Search
  CPC ... H04B 1/40; H03F 3/19; H03F 3/195; H01P 5/12; H01P 5/16; H01P 5/18; H01P 5/22
  See application file for complete search history.

(56) References Cited

U.S. PATENT DOCUMENTS

| | | | |
|---|---|---|---|
| 4,458,219 A | 7/1984 | Vorhaus | |
| 4,599,585 A | 7/1986 | Vorhaus et al. | |
| 4,635,062 A | 1/1987 | Bierig et al. | |
| 4,713,557 A | 12/1987 | Carter et al. | |
| 5,027,084 A | 6/1991 | Tsukii et al. | |
| 5,105,166 A | 4/1992 | Tsukii et al. | |
| 5,801,600 A | 9/1998 | Butland et al. | |
| 5,821,813 A | 10/1998 | Batchelor et al. | |
| 6,470,054 B1 | 10/2002 | Boudry et al. | |
| 6,636,085 B2 | 10/2003 | Okazaki et al. | |
| 6,894,657 B2 | 5/2005 | Carey | |
| 7,239,852 B2 | 7/2007 | Yang et al. | |
| 7,256,649 B2 | 8/2007 | Ksienski et al. | |
| 7,312,763 B2 | 12/2007 | Mohamadi | |
| 7,535,409 B1 | 5/2009 | Choe et al. | |

(Continued)

OTHER PUBLICATIONS

Ameen H.A., et al., "A 28 GHz Four-Channel Phased-Array Transceiver in 65-nm CMOS Technology for 5G Applications," IEEE 29th International Conference on Microelectronics (ICM), 2017, 4 Pages.

(Continued)

*Primary Examiner* — Blane J Jackson
(74) *Attorney, Agent, or Firm* — Colby Nipper/Qualcomm

(57) ABSTRACT

An apparatus is disclosed for an asymmetrical quadrature hybrid coupler. In an example aspect, an apparatus comprises a quadrature hybrid coupler. The quadrature hybrid coupler comprises a shared port, a through port, a coupled port, and an isolated port. The quadrature hybrid coupler also comprises at least one transformer, which comprises a first inductor and a second inductor. The first inductor is connected between the shared port and the coupled port. The second inductor is connected between the isolated port and the through port. The second inductor is directly connected to the isolated port. An inductance of the first inductor is different from an inductance of the second inductor.

30 Claims, 10 Drawing Sheets

(56) References Cited

U.S. PATENT DOCUMENTS

| | | | |
|---|---|---|---|
| 7,773,959 B1* | 8/2010 | Bachhuber | H04B 1/0483 |
| | | | 455/127.1 |
| 8,208,869 B2 | 6/2012 | Jeong et al. | |
| 8,319,569 B2 | 11/2012 | Kojima | |
| 9,054,792 B2 | 6/2015 | Wu et al. | |
| 9,094,102 B2 | 7/2015 | Corman et al. | |
| 9,362,871 B2 | 6/2016 | Qureshi | |
| 9,473,195 B2 | 10/2016 | Zhan et al. | |
| 9,577,600 B2 | 2/2017 | Natarajan et al. | |
| 9,837,966 B1 | 12/2017 | Ahmed et al. | |
| 2003/0227353 A1 | 12/2003 | Fayyaz | |
| 2009/0146764 A1* | 6/2009 | Chen | H01P 5/227 |
| | | | 333/21 A |
| 2011/0018626 A1 | 1/2011 | Kojima et al. | |
| 2012/0098698 A1 | 4/2012 | Reuter | |
| 2014/0128009 A1 | 5/2014 | Yeh et al. | |
| 2014/0154981 A1* | 6/2014 | Nakatani | H03F 3/195 |
| | | | 455/41.1 |
| 2014/0155003 A1* | 6/2014 | Nakatani | G01K 7/21 |
| | | | 455/90.2 |
| 2014/0287704 A1 | 9/2014 | Dupuy et al. | |
| 2016/0226142 A1 | 8/2016 | Leroux | |
| 2016/0380754 A1 | 12/2016 | Chen et al. | |
| 2017/0338854 A1 | 11/2017 | Perumana et al. | |
| 2018/0019719 A1 | 1/2018 | Roderick et al. | |
| 2018/0309464 A1 | 10/2018 | Mandegaran | |
| 2018/0309502 A1* | 10/2018 | Khandani | H04B 7/15557 |
| 2020/0021024 A1 | 1/2020 | Park et al. | |
| 2020/0091605 A1 | 3/2020 | Ngai et al. | |

OTHER PUBLICATIONS

Cetindogan B., et al., "A 6-Bit Vector-Sum Phase Shifter with a Decoder Based Control Circuit for X-Band Phased-Arrays," IEEE Microwave and Wireless Components Letters (vol. 26, Issue: 1, Jan. 2016), Jan. 2016, pp. 64-66.

Cohen E., et al., "A CMOS Bidirectional 32-Element Phased-Array Transceiver at 60 GHz With LTCC Antenna", IEEE Transactions on Microwave Theory and Techniques, Mar. 2013, vol. 61, No. 3, pp. 1359-1375.

Greene K., et al., "A 60-GHz Dual-Vector Doherty Beamformer", IEEE Journal of Solid-State Circuits, May 2017, vol. 52, No. 5, pp. 1373-1387.

Hu S., et al., "A 28GHz/37GHz/39GHz Multiband Linear Doherty Power Amplifier for 5G Massive MIMO Applications," IEEE International Solid-State Circuits Conference, Feb. 6, 2017, 3 Pages.

Hu S., et al. "A Broadband Mixed-Signal CMOS Power Amplifier with a Hybrid Class-G Doherty Efficiency Inhancement Technique," IEEE Journal of Solid-State Circuits, Mar. 2016, vol. 51, No. 3, pp. 598-613.

Kibaroglu K., et al., "An Ultra Low-Cost 32-Element 28 GHz Phased-Array Transceiver with 41 dBm EIRP and 1.0-1.6 Gbps 16-QAM Link at 300 Meters," IEEE Radio Frequency Integrated Circuits Symposium, 2017, pp. 73-76.

Kim S.J., et al., "A New Active Phase Shifter Using a Vector Sum Method," IEEE Microwave and Guided Wave Letters, Jun. 2000, vol. 10, No. 6, pp. 233-235.

Kim S.Y., et al., "An Improved Wideband Al-Pass I/Q Network for Millimeter-Wave Phase Shifters," IEEE Transactions on Microwave Theory and Techniques, vol. 60, No. 11, Nov. 2012, Nov. 2012, pp. 3431-3439.

Sah S.P., et al., "Design and Analysis of a Wideband 15-35-GHz Quadrature Phase Shifter With Inductive Loading," IEEE Transactions on Microwave Theory and Techniques, vol. 61, No. 8, Aug. 2013, Aug. 2013, pp. 3024-3033.

Shahramian S., et al., "A 70-100 GHz Direct-Conversion Transmitter and Receiver Phased Array Chipset Demonstrating 10 Gb/s Wireless Link", IEEE Journal of Solid-state Circuits, May 2013, pp. 1113-1125.

Shahramian S., et al., "A Fully Integrated Scalable W-Band Phased-Array Module with Integrated Antennas, Self-Alignment and Self-Test," IEEE International Solid-State Circuits Conference, Feb. 12, 2018, 3 Pages.

Shimura T., et al., "Low Power Consumption Vector-Sum Phase Shifters using Zero-Pi Amplifiers for Millimeter-Wave Beamforming", Proceedings of the 47th European Microwave Conference, Oct. 10-12, 2017, Nuremberg, Germany, pp. 42-45.

Sowlati T., et al., "A 60GHz 144-Element Phased-Array Transceiver with 51dBm Maximum EIRP and ±60° Beam Steering for Backhaul Application," IEEE International Solid-State Circuits Conference, Feb. 12, 2018, 3 Pages.

Valdes-Garcia, et al., "A Fully Integrated 16-Element Phased-Array Transmitter in SiGe BiCMOS for 60-GHz Communications," IEEE Journal of Solid-State Circuits, vol. 45, No. 12, Dec. 2010, pp. 2757-2773.

* cited by examiner

US 10,784,636 B1

ASYMMETRICAL QUADRATURE HYBRID COUPLER

TECHNICAL FIELD

This disclosure relates generally to wireless transceivers and, more specifically, to an asymmetrical quadrature hybrid coupler that can conserve space within a wireless transceiver.

BACKGROUND

Electronic devices use radio-frequency (RF) signals to communicate information. These radio-frequency signals enable users to talk with friends, download information, share pictures, remotely control household devices, receive global positioning information, listen to radio stations, and so forth. Over longer distances, it may be challenging to distinguish the radio-frequency signals from background noise. To address this issue, some electronic devices use an antenna array and multiple phase shifters to perform beamsteering. Beamsteering enables the electronic device to increase transmission signal strength or reception sensitivity in a particular spatial direction. In this way, the electronic device can communicate with other devices over farther distances.

To improve spatial coverage or increase dynamic range, it may be desirable to increase a quantity of antenna elements within one or more antenna arrays of the electronic device. Due to the multiple antenna elements, however, the electronic device's transceiver can become rather large and complex in order to condition and route signals provided to and accepted from each of the antenna elements. Consequently, it can be challenging for some wireless transceiver architectures to support a large quantity of antenna elements and fit within a size constraint of a given electronic device without adversely impacting system performance or increasing cost. Size constraints are especially pertinent for portable electronic devices like smartphones or wearable devices.

SUMMARY

An apparatus is disclosed that implements an asymmetrical quadrature hybrid coupler. The asymmetrical quadrature hybrid coupler can be disposed in a transmit path, a receive path, or both the transmit path and the receive path (e.g., a shareable transceiver path) of a wireless transceiver. By sharing the asymmetrical quadrature hybrid coupler within both the transmit path and the receive path, a size of the wireless transceiver can be reduced relative to other designs that have a separate quadrature hybrid coupler within each of the transmit and receive paths.

In example implementations, the asymmetrical quadrature hybrid coupler includes at least one transformer and an isolated port. An inductor of the transformer can be directly connected to the isolated port. In other words, an impedance termination, such as a resistor, is not present or connected between the transformer and the isolated port. Without the impedance termination at the isolated port, the asymmetrical quadrature hybrid coupler is less susceptible to process and temperature variations compared to other quadrature hybrid couplers that include the impedance termination. To support the direct connection between the transformer and the isolated port, the transformer includes inductors that have different inductances. The inductances are designed to achieve a particular amplitude and phase balance (e.g., a particular image rejection ratio) over a target bandwidth.

The asymmetrical quadrature hybrid coupler can be implemented within a phase shifter. In some implementations, the asymmetrical quadrature hybrid coupler is directly connected to a vector modulator of the phase shifter such that one or more intermediate transformers are not present or connected between the asymmetrical quadrature hybrid coupler and the vector modulator. As such, the footprint of the phase shifter can be smaller compared to other types of phase shifters that include the intermediate transformers. Due to the direct connection between the asymmetrical quadrature hybrid coupler and the vector modulator, the asymmetrical quadrature hybrid coupler provides both impedance matching and a direct-current (DC) voltage for the vector modulator. Additionally, by directly connecting the transformer to the isolated port, the asymmetrical quadrature hybrid coupler can provide a larger DC voltage to the vector modulator relative to designs that include an impedance termination between the transformer and the isolated port.

Directly connecting the asymmetrical quadrature hybrid coupler to the vector modulator can also enable the asymmetrical quadrature hybrid coupler to have a smaller footprint relative to other types quadrature hybrid couplers. In particular, this direct connection increases a total parasitic capacitance observed by the asymmetrical quadrature hybrid coupler due to the vector modulator. The larger parasitic capacitance enables the target amplitude and phase balance to be achieved using inductors with smaller inductances. As such, sizes of inductors within the transformer can be decreased to decrease a size of the asymmetrical quadrature hybrid coupler.

In an example aspect, an apparatus comprises a quadrature hybrid coupler. The quadrature hybrid coupler comprises a shared port, a through port, a coupled port, and an isolated port. The quadrature hybrid coupler also comprises at least one transformer, which comprises a first inductor and a second inductor. The first inductor is connected between the shared port and the coupled port. The second inductor is connected between the isolated port and the through port. The second inductor is directly connected to the isolated port. An inductance of the first inductor is different from an inductance of the second inductor.

In an example aspect, an apparatus comprises a quadrature hybrid coupler. The quadrature hybrid coupler comprises a shared port, a through port, a coupled port, and an isolated port. The quadrature hybrid coupler also comprises transformation means for coupling the shared port, the through port, the coupled port, and the isolated port together. The transformation means comprises inductance means for providing a first inductance between the shared port and the coupled port and providing a second inductance between the isolated port and the through port. The first inductance is different from the second inductance. The quadrature hybrid coupler additionally comprises means for directly connecting the inductance means to the isolated port.

In an example aspect, a method for operating a phase shifter, which includes an quadrature hybrid coupler and a vector modulator, is disclosed. The method comprises accepting an input signal at a first port of a phase shifter. The phase shifter includes an quadrature hybrid coupler and a vector modulator. The method also comprises generating an output signal at a second port of the phase shifter. The output signal has a phase that differs from a phase of the input signal. The generating of the output signal comprises propagating a first version of the input signal through a first inductor of the quadrature hybrid coupler. The first inductor is connected between a shared port of the quadrature hybrid coupler and a coupled port of the quadrature hybrid coupler. The generating of the output signal also comprises propagating a second version of the input signal through a second inductor of the quadrature hybrid coupler. The second inductor is connected between an isolated port of the quadrature hybrid coupler and a through port of the quadrature hybrid coupler. The second inductor is directly connected to the isolated port. The first inductor and the second inductor are magnetically coupled together. An inductance of the first inductor is different from an inductance of the second inductor. The generation of the output signal additionally comprises adjusting, using the vector modulator that is coupled to the through port and the coupled port, amplitudes of the first version of the input signal and the second version of the input signal.

In an example aspect, an apparatus comprises a phase shifter. The phase shifter comprises a vector modulator and an quadrature hybrid coupler. The vector modulator comprises a first variable gain amplifier and a second variable gain amplifier. The quadrature hybrid coupler comprises a through port and a coupled port. The through port is directly connected to the first variable gain amplifier. The coupled port is directly connected to the second variable gain amplifier.

BRIEF DESCRIPTION OF DRAWINGS

FIG. 7-1 illustrates example bias circuitry that enables bidirectional operation of an asymmetrical quadrature hybrid coupler.

FIG. 7-2 illustrates a first configuration of bias circuitry for propagating a signal for transmission.

FIG. 7-3 illustrates a second configuration of bias circuitry for propagating a signal for reception.

DETAILED DESCRIPTION

Figure 1:
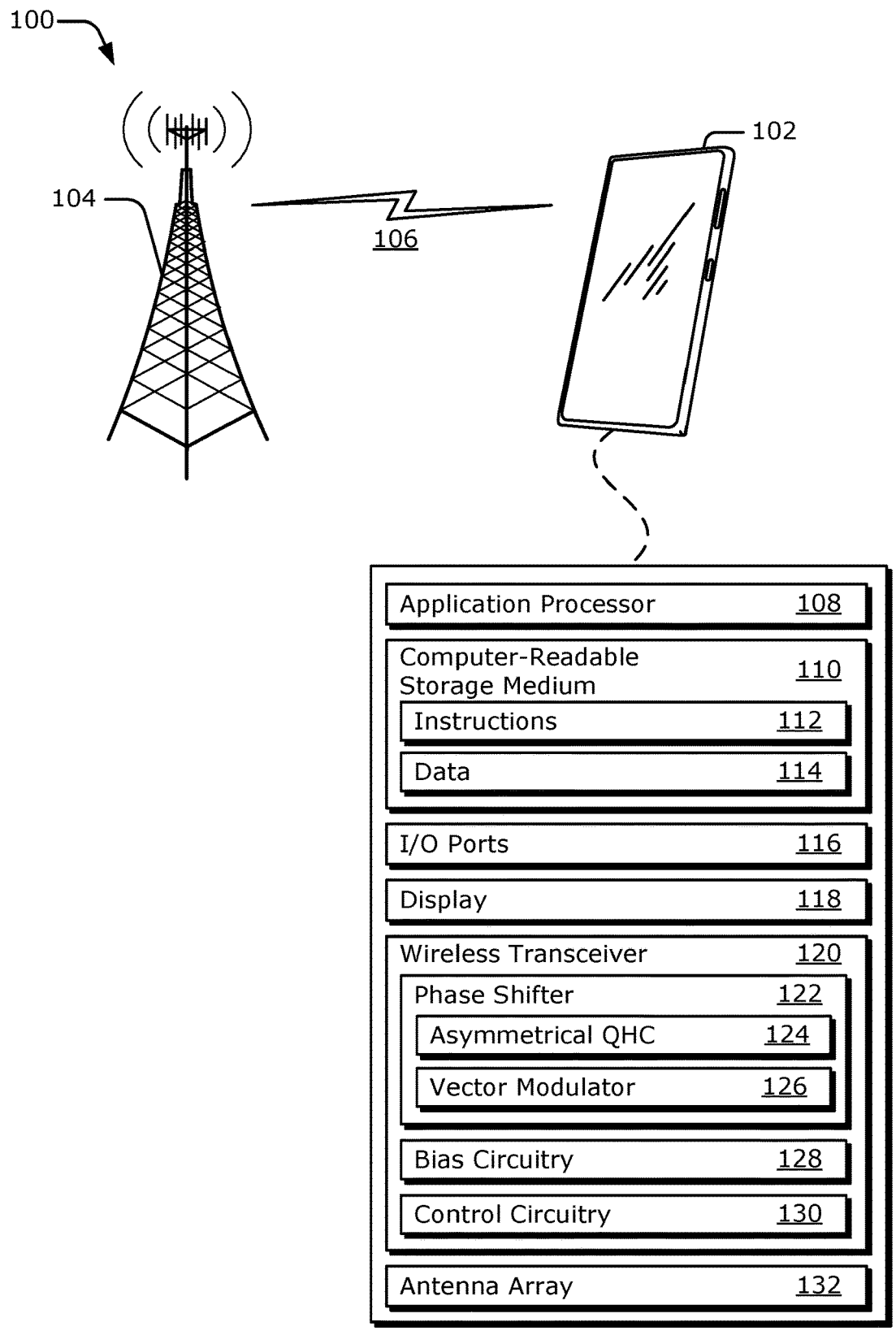
FIG. 1 illustrates an example operating environment for a computing device that includes an asymmetrical quadrature hybrid coupler.

It can be challenging to design a wireless transceiver architecture that supports a large quantity of antenna elements associated with one or more antenna arrays and fits within a size constraint of a given electronic device without adversely impacting system performance or increasing cost. This is especially relevant for portable electronic devices like smartphones or wearable devices. To address this challenge, some wireless transceiver designs use passive components, which can be bidirectional. Due to the bidirectionality, the passive components can be shared by both a transmit path and a receive path to conserve space within the wireless transceiver. Some passive components, however, can have limited performance or occupy a larger area relative to their active counterparts. Use of passive components can also increase loss within the wireless transceiver and thereby degrade signal-to-noise performance of the wireless transceiver. Other wireless transceiver designs use switches to enable the transmit and receive paths to reuse components. The switches, however, can add loss, increase routing complexity, degrade linearity performance, and lower isolation between the transmit and receive paths.

To conserve space within the wireless transceiver, techniques that implement an asymmetrical quadrature hybrid coupler are described herein. The asymmetrical quadrature hybrid coupler can be disposed in a transmit path, a receive path, or both the transmit path and the receive path (e.g., a shareable transceiver path) of a wireless transceiver. By sharing the asymmetrical quadrature hybrid coupler within both the transmit path and the receive path, a size of the wireless transceiver can be reduced relative to other designs that have a separate quadrature hybrid coupler within each of the transmit and receive paths.

In example implementations, the asymmetrical quadrature hybrid coupler includes at least one transformer and an isolated port. An inductor of the transformer can be directly connected to the isolated port. In other words, an impedance termination, such as a resistor, is not present or connected between the transformer and the isolated port. Without the impedance termination at the isolated port, the asymmetrical quadrature hybrid coupler is less susceptible to process and temperature variations compared to other quadrature hybrid couplers that include the impedance termination. To support the direct connection between the transformer and the isolated port, the transformer includes inductors that have different inductances. The inductances are designed to achieve a particular amplitude and phase balance (e.g., a particular image rejection ratio) over a target bandwidth.

The asymmetrical quadrature hybrid coupler can be implemented within a phase shifter. In some implementations, the asymmetrical quadrature hybrid coupler is directly connected to a vector modulator of the phase shifter such that one or more intermediate transformers are not present or connected between the asymmetrical quadrature hybrid coupler and the vector modulator. As such, the footprint of the phase shifter can be smaller compared to other types of phase shifters that include the intermediate transformers. Due to the direct connection between the asymmetrical quadrature hybrid coupler and the vector modulator, the asymmetrical quadrature hybrid coupler provides both impedance matching and a direct-current (DC) voltage for the vector modulator. Additionally, by directly connecting the transformer to the isolated port, the asymmetrical quadrature hybrid coupler can provide a larger DC voltage to the vector modulator relative to designs that include an impedance termination between the transformer and the isolated port.

Directly connecting the asymmetrical quadrature hybrid coupler to the vector modulator can also enable the asymmetrical quadrature hybrid coupler to have a smaller footprint relative to other types quadrature hybrid couplers. In particular, this direct connection increases a total parasitic capacitance observed by the asymmetrical quadrature hybrid coupler due to the vector modulator. The larger parasitic capacitance enables the target amplitude and phase balance to be achieved using inductors with smaller inductances. As such, sizes of inductors within the transformer can be decreased to decrease a size of the asymmetrical quadrature hybrid coupler.

As used herein, "couple," "coupled," or "coupling" refers to a relationship between two or more components that are in operative communication magnetically, electromagnetically, or by being electrically connected to implement some feature or realize some capability that is described. The term "connect," "connected," or "connecting" refers to an electrical connection using a physical line, such as a metal trace or wire. In some cases, the electrical connection is provided using a capacitor. A connection can include a direct connection or an indirect connection. A direct connection refers to connecting discrete circuit elements via a same node without an intervening element. An indirect connection refers to connecting discrete circuit elements via one or more other devices or other discrete circuit elements.

FIG. 1 illustrates an example operating environment 100 for a computing device 102 that includes an asymmetrical quadrature hybrid coupler 124. In the environment 100, the computing device 102 communicates with a base station 104 through a wireless communication link 106 (wireless link 106). In this example, the computing device 102 is depicted as a smartphone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, sensor or security device, vehicle-based communication system, radio apparatus, radar, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, server device, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, an uplink of other data or control information communicated from the computing device 102 to the base station 104, or both a downlink and an uplink. The wireless link 106 may be implemented using any suitable communication protocol or standard, such as second-generation (2G), third-generation (3G), fourth-generation (4G), or fifth-generation (5G) cellular; IEEE 802.11 (e.g., Wi-Fi™); IEEE 802.15 (e.g., Bluetooth™); IEEE 802.16 (e.g., WiMAX™); and so forth. In some implementations, the wireless link 106 wirelessly provides power and the base station 104 includes a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless local area network (LAN) (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna array 132. Components of the wireless transceiver 120 can include amplifiers, switches, mixers, analog-to-digital converters, filters, and so forth for conditioning the communication signals (e.g., for generating or processing signals). The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receive paths). In general, the wireless transceiver 120 processes data and/or signals associated with communicating data of the computing device 102 using the antenna array 132. In some implementations, the wireless transceiver 120 is implemented as a time-division duplex wireless transceiver, which can generate an uplink signal during one time slot and can process a downlink signal during a different time slot.

The wireless transceiver 120 includes at least one phase shifter 122. The phase shifter 122 includes an asymmetrical quadrature hybrid coupler (QHC) 124 and a vector modulator 126, which are further described with respect to FIGS. 3, 5, and 6. Although shown as being within the phase shifter 122, the asymmetrical quadrature hybrid coupler 124 can alternatively be implemented separate from the phase shifter 122, such as within a balanced amplifier of the wireless transceiver 120.

Some quadrature hybrid couplers include two inductors that are magnetically coupled together and have approximately equal inductances. Due to the similar inductances, these quadrature hybrid couplers are considered to be symmetrical. In contrast, the asymmetrical quadrature hybrid coupler 124 is a type of quadrature hybrid coupler that includes at least two inductors that are magnetically coupled together and have different inductances. In other words, one inductor of the asymmetrical quadrature hybrid coupler 124 has a larger inductance than another inductor of the asymmetrical quadrature hybrid coupler 124. Due to the different inductances, this type of quadrature hybrid coupler is considered to be asymmetrical.

The asymmetrical quadrature hybrid coupler 124 includes at least one transformer and at least one isolated port. In some implementations, the transformer is directly connected to the isolated port. In other words, an impedance termination, such as a resistor, is not be present or connected between the transformer and the isolated port. As such, an impedance between the transformer and the isolated port can be appreciably less than 50 ohms for a single-ended implementation (e.g., less than or equal to approximately 10 ohms or approximately equal to zero ohms). For a differential implementation, the impedance between the transformer and the isolated port can be appreciably less than 100 ohms (e.g., less than or equal to approximately 20 ohms, or approximately equal to zero ohms).

To compensate for the direct connection between the transformer and the isolated port and to achieve a target amplitude and/or phase balance, inductors within the transformer are designed to be unbalanced (e.g., have different inductances). For instance, an inductance of a first inductor of the transformer is designed to be larger than an inductance of a second inductor of the transformer that is directly connected to the isolated port. By directly connecting the second inductor to the isolated port, the asymmetrical quadrature hybrid coupler 124 is less susceptible to process and temperature variations as compared to other types of quadrature hybrid couplers that include a resistor between the transformer and the isolated port, such as a 50 ohm resistor for a single-ended implementation or a 100 ohm resistor for a differential implementation.

The vector modulator 126 is connected to the asymmetrical quadrature hybrid coupler 124. In some implementations, at least one intermediate transformer is connected between the asymmetrical quadrature hybrid coupler 124 and the vector modulator 126. This intermediate transformer can provide impedance matching and a DC voltage to the vector modulator 126. In other implementations, the vector modulator 126 is directly connected to the asymmetrical quadrature hybrid coupler 124. In this case, the asymmetrical quadrature hybrid coupler 124 provides both impedance matching and at least one DC voltage for the vector modulator 126. By obviating the use of the intermediate transformer, the asymmetrical quadrature hybrid coupler 124 enables the phase shifter 122 to have a smaller footprint relative to other phase shifters that include an intermediate transformer between the vector modulator 126 and a quadrature hybrid coupler.

In some cases, the phase shifter 122 is not bidirectional and is therefore implemented within a transmit path of the wireless transceiver 120 or a receive path of the wireless transceiver 120. In other cases, the phase shifter 122 is bidirectional and can be implemented within both the transmit path and the receive path (e.g., within a shareable transceiver path). By sharing the phase shifter 122 between the transmit path and the receive path, an overall footprint of the wireless transceiver 120 can be smaller relative to other wireless transceivers that include a separate phase shifter within each of the transmit path and the receive path. The phase shifter 122 can adjust phases of signals that are transmitted and/or received via the antenna array 132. Using the phase shifter 122, the wireless transceiver 120 can employ beamsteering techniques to improve dynamic range performance.

The phase shifter 122 can be implemented as an active phase shifter, a passive phase shifter, or a phase shifter that can dynamically operate in an active mode or a passive mode based on a configuration of the vector modulator 126. In general, an active phase shifter or a phase shifter that operates in the active mode can realize a higher bit resolution relative to a passive phase shifter or a phase shifter that operates in the passive mode. However, the active phase shifter or the phase shifter that operates in the active mode consumes more power relative to the passive phase shifter or the phase shifter that operates in the passive mode.

The wireless transceiver 120 also includes bias circuitry 128 and control circuitry 130. The bias circuitry 128 is directly connected to the isolated port of the asymmetrical quadrature hybrid coupler 124 and provides a bias voltage at the isolated port. Due to the direct connection between the transformer and the isolated port, an intermediate component, such as a resistor, is not present or connected between the bias voltage provided by the bias circuitry 128 and the transformer of the asymmetrical quadrature hybrid coupler 124. As such, the transformer of the asymmetrical quadrature hybrid coupler 124 is directly connected to the bias voltage.

The bias circuitry 128 provides a bias voltage that enables signals to propagate through the asymmetrical quadrature hybrid coupler 124 in at least one direction. For single-direction use of the asymmetrical quadrature hybrid coupler 124, the bias circuitry 128 provides either a ground or a supply voltage as the bias voltage, depending on whether the asymmetrical quadrature hybrid coupler 124 is implemented within a transmit path or a receive path of the wireless transceiver 120, respectively. For bidirectional use of the asymmetrical quadrature hybrid coupler 124, the bias circuitry 128 includes circuitry that selectively provides the ground or the supply voltage as the bias voltage. As an example, the bias circuitry 128 can be implemented using a switch or a multiplexer. Depending on the bias voltage, the bias circuitry 128 enables a signal to propagate in a forward direction through the asymmetrical quadrature hybrid coupler 124 for transmission or in a reverse direction for reception, respectively. In some cases, the bias circuitry 128 can also provide other bias voltages to other components within the wireless transceiver 120, such as the vector modulator 126.

The control circuitry 130 can be implemented within or separate from the wireless transceiver 120 as a modem, a general-purpose processor, a controller, fixed logic circuitry, hard-coded logic, some combination thereof, and so forth. Components of the control circuitry 130 can be localized at one module (e.g., an integrated circuit chip) or can be distributed across multiple modules. Although not explicitly shown, the control circuitry 130 can include at least one CRM (e.g., the CRM 110), can include a portion of the CRM 110, or can access the CRM 110 to obtain computer-readable instructions (e.g., instructions 112). The control circuitry 130 at least partially controls the wireless transceiver 120 and enables wireless communication to be performed.

The control circuitry 130 can be connected to the phase shifter 122 and control respective configurations of the phase shifter 122. For example, the control circuitry 130 can cause the phase shifter 122 to dynamically switch between the active mode and the passive mode based on a current operational mode of the wireless transceiver 120. Different types of operational modes may include a transmission mode, a reception mode, different spatial coverage modes, different frequency modes (e.g., a high-frequency mode or a low-frequency mode), different power modes (e.g., a low-power mode or a high-power mode), different resource control states (e.g., a connected mode, an inactive mode, or an idle mode), different modulation modes (e.g., lower-order modulation modes such as quadrature phase-shift keying (QPSK) modes or higher-order modulation modes such as 64 quadrature amplitude modulation (QAM) or 256 QAM), and so forth. As another example, the control circuitry 130 specifies relative phase offsets between multiple phase shifters 122 that are respectively associated with different antenna elements of the antenna array 132. By controlling the relative phase offsets, the control circuitry 130 can use beamsteering techniques to increase transmission power or increase reception sensitivity along a particular direction.

Additionally or alternatively, the control circuitry 130 can be connected to the bias circuitry 128. In this manner, the control circuitry 130 can specify the bias voltage generated by the bias circuitry 128 based on the current operational mode of the wireless transceiver 120 (e.g., whether the wireless transceiver 120 is in a transmission mode or a reception mode).

Figure 2:
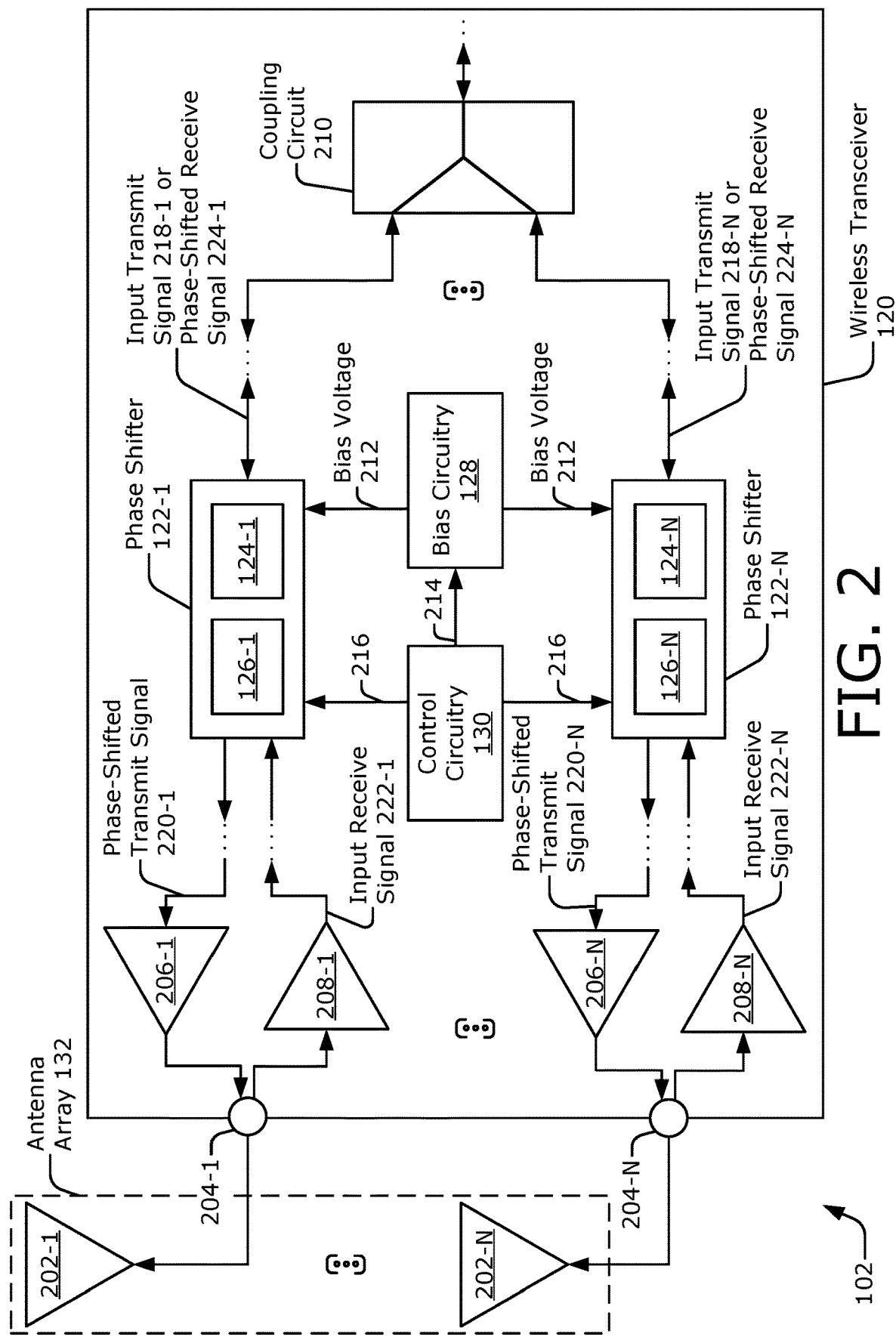
FIG. 2 illustrates an example wireless transceiver including multiple asymmetrical quadrature hybrid couplers.

FIG. 2 illustrates an example wireless transceiver 120 including multiple asymmetrical quadrature hybrid couplers 124-1 to 124-N, with N representing a positive integer. In the depicted configuration, the antenna array 132 includes multiple antenna elements 202-1 to 202-N. A quantity of the antenna elements 202-1 to 202-N is shown to equal a quantity of asymmetrical quadrature hybrid couplers 124-1 to 124-N. In other implementations, these quantities may differ. The antenna elements 202-1 to 202-N are respectively connected to antenna nodes 204-1 to 204-N of the wireless transceiver 120. Together, the antenna array 132 and the wireless transceiver 120 transmit uplink signals and receive downlink signals during different time slots.

The wireless transceiver 120 includes multiple transmit paths with multiple power amplifiers 206-1 to 206-N respectively connected to the antenna nodes 204-1 to 204-N. The wireless transceiver 120 also includes multiple receive paths with multiple low-noise amplifiers 208-1 to 208-N respectively connected to the antenna nodes 204-1 to 204-N. Phase shifters 122-1 to 122-N are respectively connected (e.g., indirectly connected or directly connected) to the power amplifiers 206-1 to 206-N and the low-noise amplifiers 208-1 to 208-N. In some implementations, a network of switches or a multiplexer selectively connects the phase shifters 122-1 to 122-N to the power amplifiers 206-1 to 206-N or the low-noise amplifiers 208-1 to 208-N, respectively. The phase shifters 122-1 to 122-N respectively include asymmetrical quadrature hybrid couplers 124-1 to 124-N and vector modulators 126-1 to 126-N.

The wireless transceiver 120 also includes a coupling circuit 210, which is connected to the phase shifters 122-1 to 122-N. The coupling circuit 210 operates as a splitter or a combiner based on the operational mode of the wireless transceiver 120. The coupling circuit 210 can be connected to other components within the wireless transceiver 120 that are not shown in FIG. 2, such as mixers, filters, other amplifiers, analog-to-digital converters, digital-to-analog converters, switches, multiplexers, and so forth. In some cases, the coupling circuit 210 comprises a single stage that combines N signals together into a single signal or splits a single signal into N signals. In other cases, the coupling circuit 210 comprises multiple stages that incrementally combine N signals together to produce a single signal or incrementally split a single signal into N signals.

The bias circuitry 128 is connected to the phase shifters 122-1 to 122-N and provides at least one bias voltage 212 at isolated ports of the asymmetrical quadrature hybrid couplers 124-1 to 124-N. In this case, the bias circuitry 128 generates the bias voltage 212 to have a voltage that is based on a configuration signal 214 provided by the control circuitry 130.

In addition to being connected to the bias circuitry 128, the control circuitry 130 is also connected to the phase shifters 122-1 to 122-N and generates another configuration signal 216. The configuration signal 216 can comprise multiple signals that are sent to respective phase shifters 122-1 to 122-N. Alternatively, the configuration signal 216 can comprise a multi-bit signal with each bit or group of bits respectively controlling the respective phase shifters 122-1 to 122-N. Using the configuration signal 216, the control circuitry 130 controls, for example, relative phase offsets that are applied across the phase shifters 122-1 to 122-N. The control circuitry 130 can determine the relative phase offsets based on a target direction that is selected for increasing transmission power or sensitivity. In some cases, the target direction is based on a known direction to the base station 104 of FIG. 1.

In some implementations, the control circuitry 130 can also use the configuration signal 216 to control operational modes of the phase shifters 122-1 to 122-N. The control circuitry 130 can determine a mode at a particular time based on a quantity of antenna elements 202-1 to 202-N, which may vary across different types of computing devices 102. The control circuitry 130 can also determine the mode based on available power, based on a target dynamic range performance, which can vary based on a selected carrier frequency or based on a current distance between the computing device 102 and the base station 104, and so forth. In general, the active mode improves performance of the wireless transceiver 120 and utilizes a larger amount of power relative to the passive mode.

During a transmit operation, the wireless transceiver 120 accepts an input baseband signal (not shown). The wireless transceiver 120 upconverts the input baseband signal to generate a input radio-frequency signal (not shown). In some implementations, the input radio-frequency signal has a millimeter wavelength. The coupling circuit 210 splits the input radio-frequency signal into multiple input transmit signals 218-1 to 218-N. The multiple input transmit signals 218-1 to 218-N can have similar amplitudes and similar phases. The phase shifters 122-1 to 122-N respectively generate phase-shifted transmit signals 220-1 to 220-N based on the input transmit signals 218-1 to 218-N. The phase-shifted transmit signals 220-1 to 220-N can have different phases or different amplitudes relative to the input transmit signals 218-1 to 218-N. The power amplifiers 206-1 to 206-N amplify the phase-shifted transmit signals 220-1 to 220-N for transmission via the antenna elements 202-1 to 202-N. The phase-shifted transmitted signals 220-1 to 220-N can represent an uplink signal.

During a receive operation, the antenna array 132 can receive a downlink signal (not shown). The low-noise amplifiers 208-1 to 208-N generate input receive signals 222-1 to 222-N based on the downlink signal. Relative phases of the input receive signals 222-1 to 222-N can differ due to differences in locations of the antenna elements 202-1 and 202-N and an angle of arrival of the downlink signal. Likewise, relative amplitudes of the input receive signals 222-1 to 222-N can also differ due to differences in locations of the antenna elements 202-1 and 202-N, due to differences in routing lengths between the antenna elements 202-1 to 202-N and the antenna nodes 204-1 to 204-N, or due to performance differences of the antenna elements 202-1 to 202-N.

The phase shifters 122-1 to 122-N generate phase-shifted receive signals 224-1 to 224-N based on the input receive signals 222-1 to 222-N. For example, the phase shifters 122-1 to 122-N can compensate for the relative phase differences between the input receive signals 222-1 to 222-N by causing the phase-shifted receive signals 224-1 to 224-N to have substantially similar phases. In other words, the phase-shifted receive signals 224-1 to 224-N generally have smaller relative phase offsets compared to relative phase offsets between the input receive signals 222-1 to 222-N. In this way, the phase-shifted receive signals 224-1 to 224-N can be constructively combined via the coupling circuit 210 to increase sensitivity.

By combining the phase-shifted receive signals 224-1 to 224-N together, the coupling circuit 210 generates a composite radio-frequency signal (not shown). The wireless transceiver 120 downconverts the composite radio-frequency signal to generate a composite baseband signal. The wireless transceiver 120 provides the composite baseband signal to a modem or processor. In general, the phase-shifting adjustments described above enable the computing device 102 to communicate with other devices at farther distances. Operation of the asymmetrical quadrature hybrid couplers 124-1 to 124-N and the vector modulators 126-1 to 126-N are further described with respect to FIGS. 3 and 4.

Figure 3:
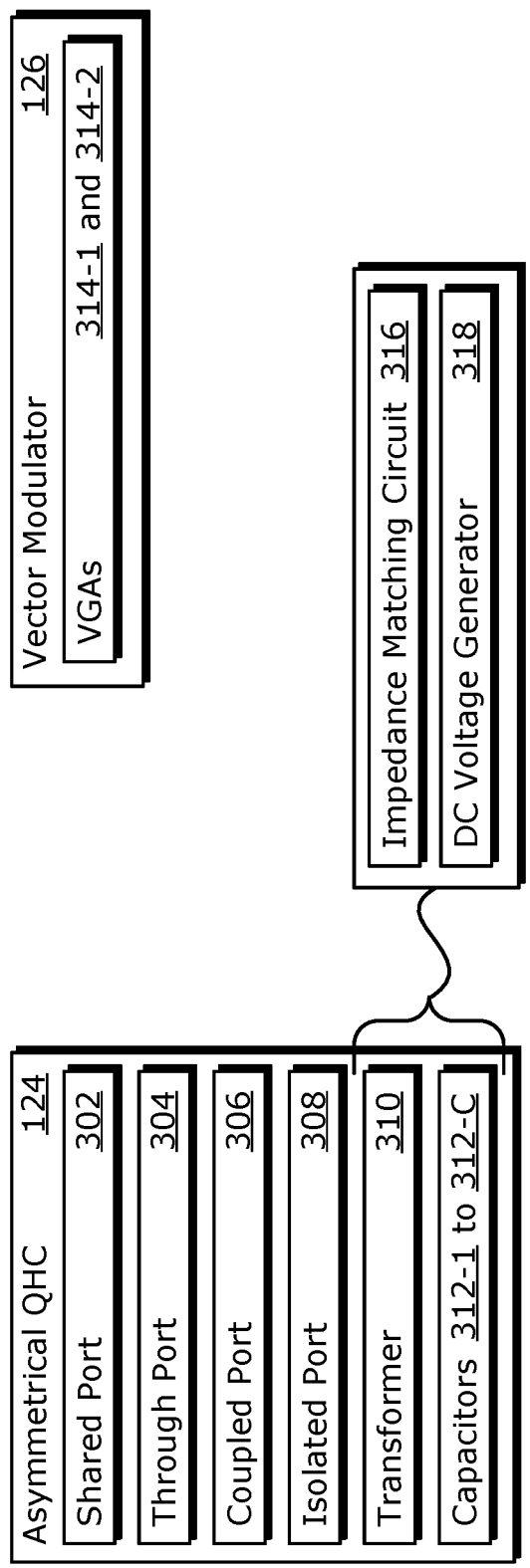
FIG. 3 illustrates components of an example asymmetrical quadrature hybrid coupler and an example vector modulator.

FIG. 3 illustrates components of an example asymmetrical quadrature hybrid coupler 124 and an example vector modulator 126. In the depicted configuration, the asymmetrical quadrature hybrid coupler 124 includes a shared port 302, a through port 304, a coupled port 306, and an isolated port 308. The asymmetrical quadrature hybrid coupler 124 also includes at least one transformer 310 and multiple capacitors 312-1 to 312-C, with C representing a positive integer greater than one.

The transformer 310, which can represent transformation means, includes two inductors that are magnetically coupled to each other. The two inductors can represent inductance means. A first inductor is connected between the shared port 302 and the coupled port 306. A second inductor is connected between the isolated port 308 and the through port 304. By directly connecting the second inductor to the isolated port 308, the asymmetrical quadrature hybrid coupler 124 can provide a larger DC voltage to the vector modulator 126 relative to designs that include an impedance termination (e.g., a resistor) between the second inductor and the isolated port 308.

To compensate for the direct connection between the second inductor and the isolated port 308 and to achieve a particular amplitude and/or phase balance (e.g., a particular image rejection ratio), the first inductor and the second inductor have different inductances. In this sense, the inductors of the transformer 310 are unbalanced. In an example implementation, an inductance of the first inductor is greater than an inductance of the second inductor. As such, a ratio of the inductances of the first inductor and the second inductor is greater than one. Example ratios are approximately greater than or equal to 1.2, approximately greater than or equal to 1.5, or approximately greater than or equal to 1.6. The inductances of the inductors are also designed based on capacitances of the multiple capacitors 312-1 to 312-C, a magnetic coupling coefficient between the inductors, interwinding capacitance within the transformer 310, and parasitic capacitance of the vector modulator 126 assuming the asymmetrical quadrature hybrid coupler 124 is directly connected to the vector modulator 126. An example parasitic capacitance of the vector modulator 126 is based on a gate-to-source capacitance of one or more transistors within the vector modulator 126.

The asymmetrical quadrature hybrid coupler 124 provides an approximately ninety-degree phase delta between the through port 304 and the coupled port 306. During transmission, the asymmetrical quadrature hybrid coupler 124 generates an in-phase signal at the through port 304 and a quadrature signal at the coupled port 306 based on an input signal that is accepted at the shared port 302. Due to the ninety-degree phase delta, phases of the in-phase signal and the quadrature signal differ by approximately ninety degrees. During reception, the asymmetrical quadrature hybrid coupler 124 generates an output signal at the shared port 302 based on in-phase signals respectively accepted at the through port 304 and the coupled port 306. Due to the ninety-degree phase delta, the output signal has a phase that represents a summation of a phase of one of the in-phase signals and a phase of another of the in-phase signals that is shifted by ninety degrees.

Figure 5:
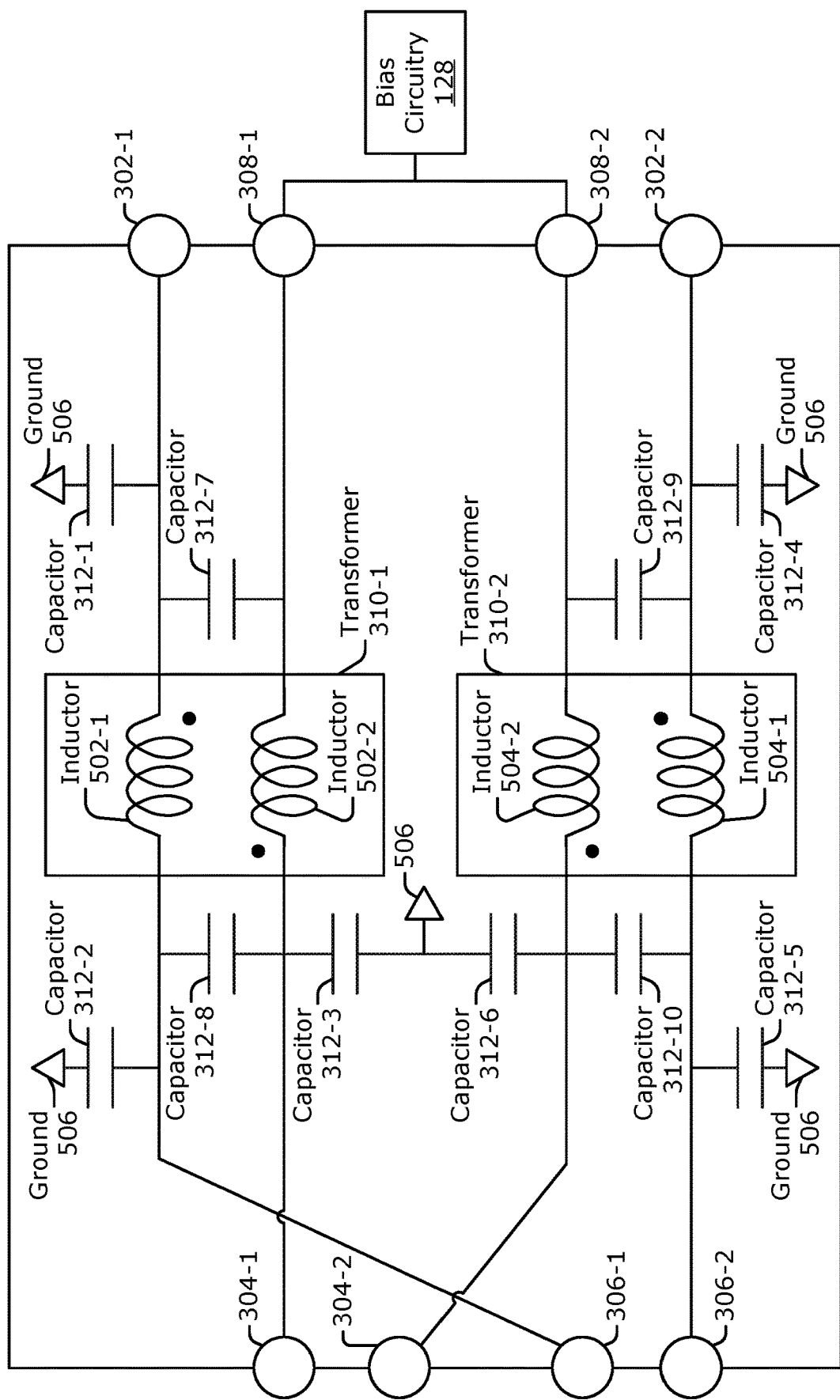
FIG. 5 illustrates an example differential implementation of an asymmetrical quadrature hybrid coupler.

In some implementations, the asymmetrical quadrature hybrid coupler 124 is implemented as a single-ended asymmetrical quadrature hybrid coupler 124. In other implementations, the asymmetrical quadrature hybrid coupler 124 is implemented as a differential asymmetrical quadrature hybrid coupler, as shown in FIG. 5.

The vector modulator 126 includes at least two variable gain amplifiers 314-1 and 314-2. In some cases, the variable gain amplifiers 314-1 and 314-2 can operate in an active mode or in a passive mode, depending on design. In other cases, the variable gain amplifiers 314-1 and 314-2 can selectively operate in either the active mode or the passive mode, depending on the configuration signal 216 (of FIG. 2). Sometimes the variable gain amplifiers 314-1 and 314-2 are bidirectional and enable the phase shifter 122 to be shared by both the transmit path and the receive path. In general, the vector modulator 126 adjusts amplitudes of signals to achieve a target phase offset. Using the variable gain amplifiers 314-1 and 314-2, the vector modulator 126 can amplify, attenuate, or invert amplitudes of incoming signals. In other cases, the vector modulator 126 maintains an amplitude of one or more of the signals such that the amplitude remains relatively unchanged (e.g., provides buffering). In other words, the vector modulator 126 can increase an incoming signal's amplitude, decrease the incoming signal's amplitude, invert the signal's amplitude by adjusting the incoming signal's phase by 180 degrees, or keep the incoming signal's amplitude relatively unchanged.

In some implementations, the phase shifter 122 includes two intermediate transformers (not shown) that are connected between the asymmetrical quadrature hybrid coupler 124 and the vector modulator 126. For example, a first intermediate transformer can be coupled between the through port 304 and the variable gain amplifier 314-1. Similarly, a second intermediate transformer can be coupled between the coupled port 306 and the variable gain amplifier 314-2.

In other implementations, the asymmetrical quadrature hybrid coupler 124 is directly connected to the variable gain amplifiers 314-1 and 314-2 such that one or more intermediate transformers are not present or connected between the asymmetrical quadrature hybrid coupler 124 and the variable gain amplifiers 314-1 and 314-2. As such, the transformer 310 and the capacitors 312-1 to 312-C of the asymmetrical quadrature hybrid coupler 124 implement an impedance matching circuit 316 and a DC voltage generator 318 for the variable gain amplifiers 314-1 and 314-2. In this implementation, the variable gain amplifiers 314-1 and 314-2 are implemented as transconductance amplifiers and have real impedances that are approximately equal to 50 ohms for single-ended implementations or real impedances that are approximately equal to 100 ohms for differential implementations (e.g., within approximately 10% or 15%). The transconductance amplifiers also have imaginary impedances due to parasitic capacitance. By obviating the use of these intermediate transformers, the asymmetrical quadrature hybrid coupler 124 enables the phase shifter 122 to have a smaller footprint relative to other phase shifters 122 that include the intermediate transformers.

Directly connecting the asymmetrical quadrature hybrid coupler 124 to the variable gain amplifiers 314-1 and 314-2 can also enable the asymmetrical quadrature hybrid coupler 124 to have a smaller footprint relative to other types of quadrature hybrid couplers. In particular, the variable gain amplifiers 314-1 and 314-2 increase the parasitic capacitance observed by the asymmetrical quadrature hybrid coupler 124. As such, inductances of the inductors within the transformer 310 can be decreased to decrease a size of the asymmetrical quadrature hybrid coupler 124.

Figure 4:
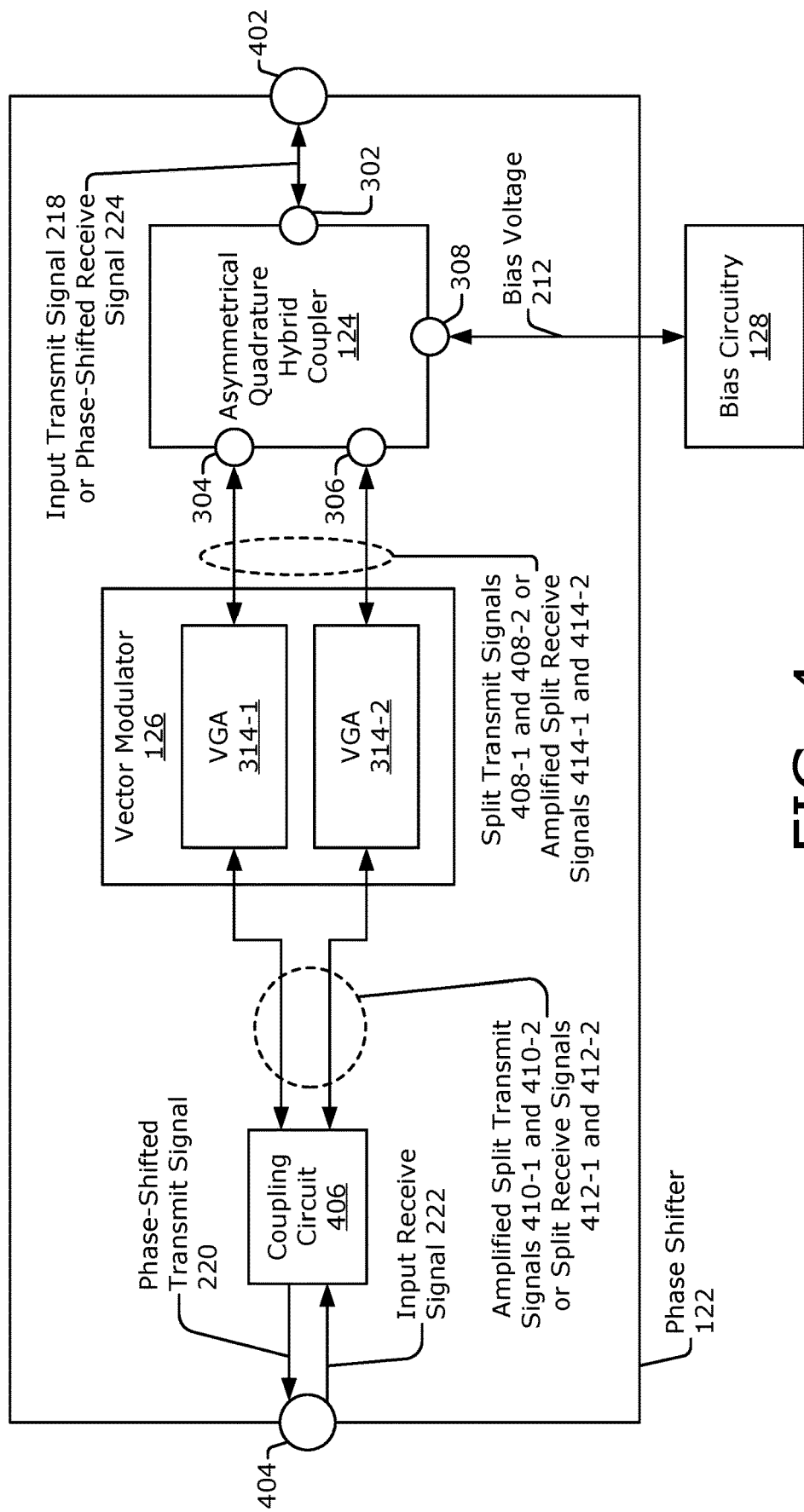
FIG. 4 illustrates an example implementation of a phase shifter that includes an asymmetrical quadrature hybrid coupler that is directly connected to a vector modulator.

FIG. 4 illustrates an example implementation of a phase shifter 122 that includes an asymmetrical quadrature hybrid coupler 124 that is directly connected to a vector modulator 126. In the depicted configuration, the phase shifter 122 is implemented as a bidirectional phase shifter. The phase shifter 122 includes a first port 402, a second port 404, the asymmetrical quadrature hybrid coupler 124, the vector modulator 126, and a coupling circuit 406. The first port 402 is connected to the coupling circuit 210 of FIG. 2. The second port 404 is connected to one of the power amplifiers 206-1 to 206-N and/or one of the low-noise amplifiers 208-1 to 208-N of FIG. 2. During a transmit operation, the first port 402 operates as an input port, and the second port 404 operates as an output port. Alternatively, during a receive operation, the second port 404 operates as the input port, and the first port 402 operates as the output port, as further described below.

In the depicted configuration, the shared port 302 of the asymmetrical quadrature hybrid coupler 124 is connected to the first port 402 of the phase shifter 122. The through port 304 is directly connected to the variable gain amplifier 314-1 of the vector modulator 126. Additionally, the coupled port 306 is directly connected to the variable gain amplifier 314-2. The bias circuitry 128 is directly connected to the isolated port 308.

Due to the direct connection, the variable gain amplifiers 314-1 and 314-2 pull current through the asymmetrical quadrature hybrid coupler 124 during operation. The asymmetrical quadrature hybrid coupler 124 transforms the current into DC voltages at the through port 304 and the coupled port 306 using one or more transformers 310 of FIG. 3. In this manner, the asymmetrical quadrature hybrid coupler 124 acts as a load of the vector modulator 126.

Figures 1, 7:
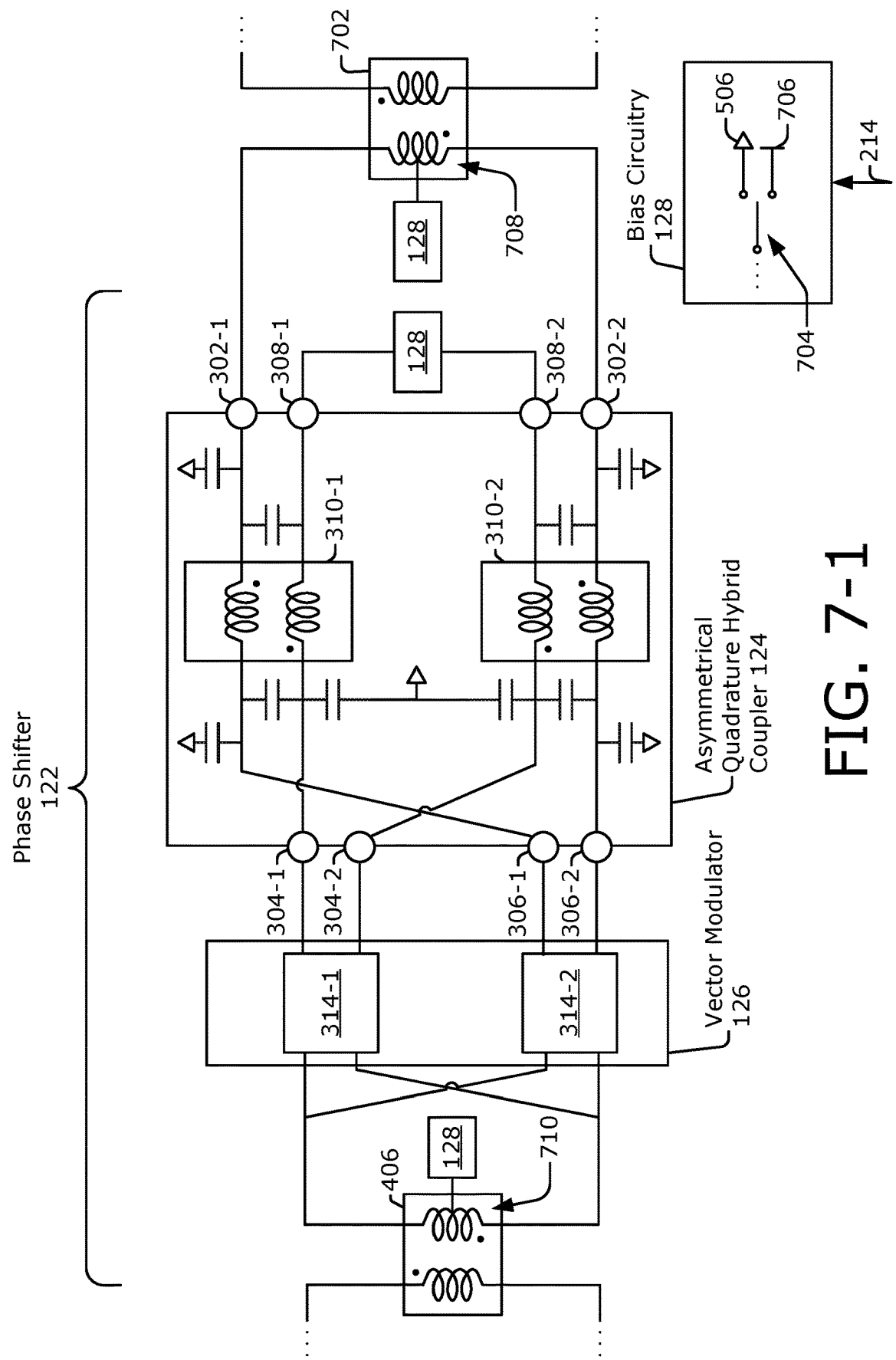
Figures 2, 7:
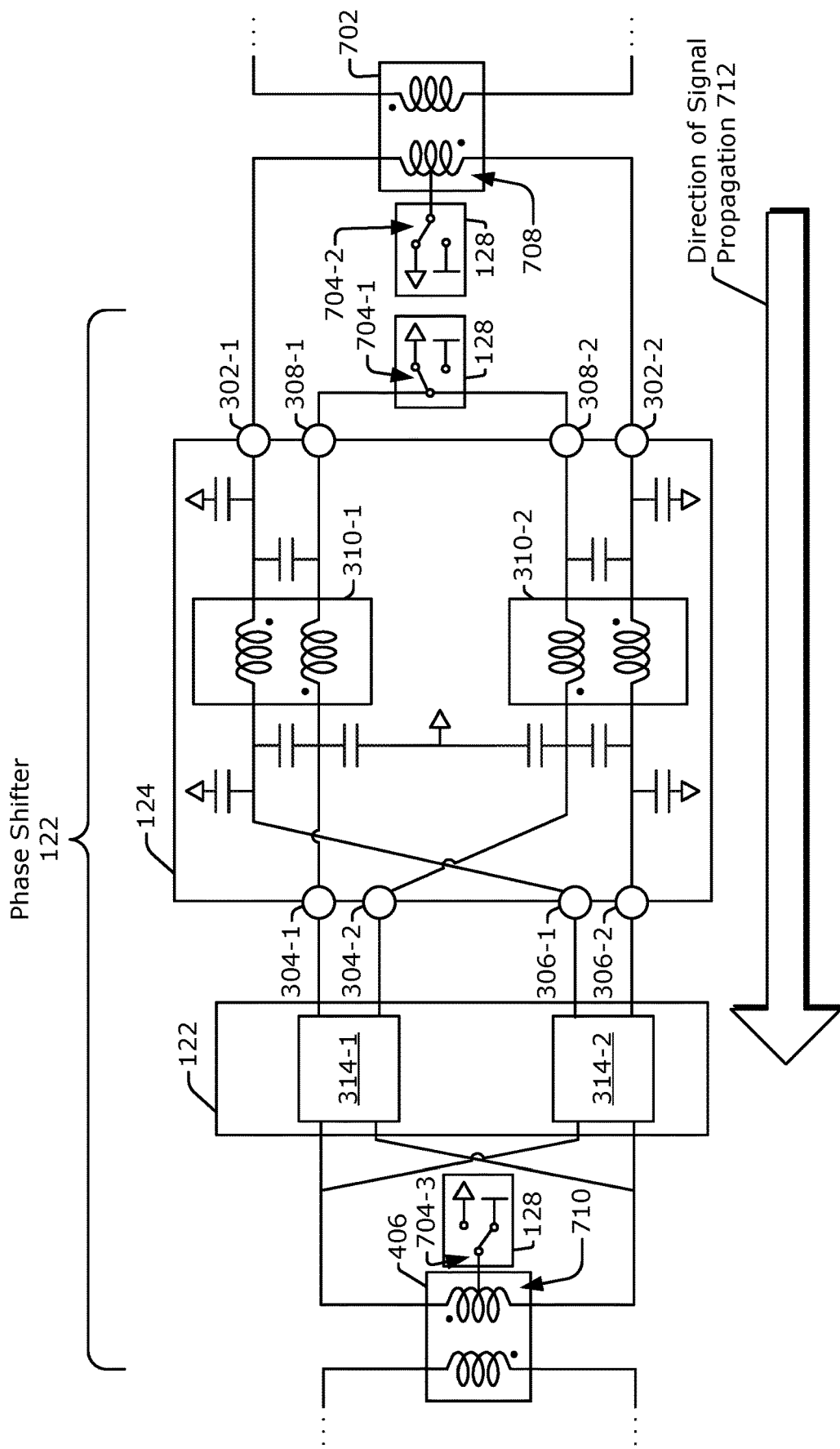
Figures 3, 7:
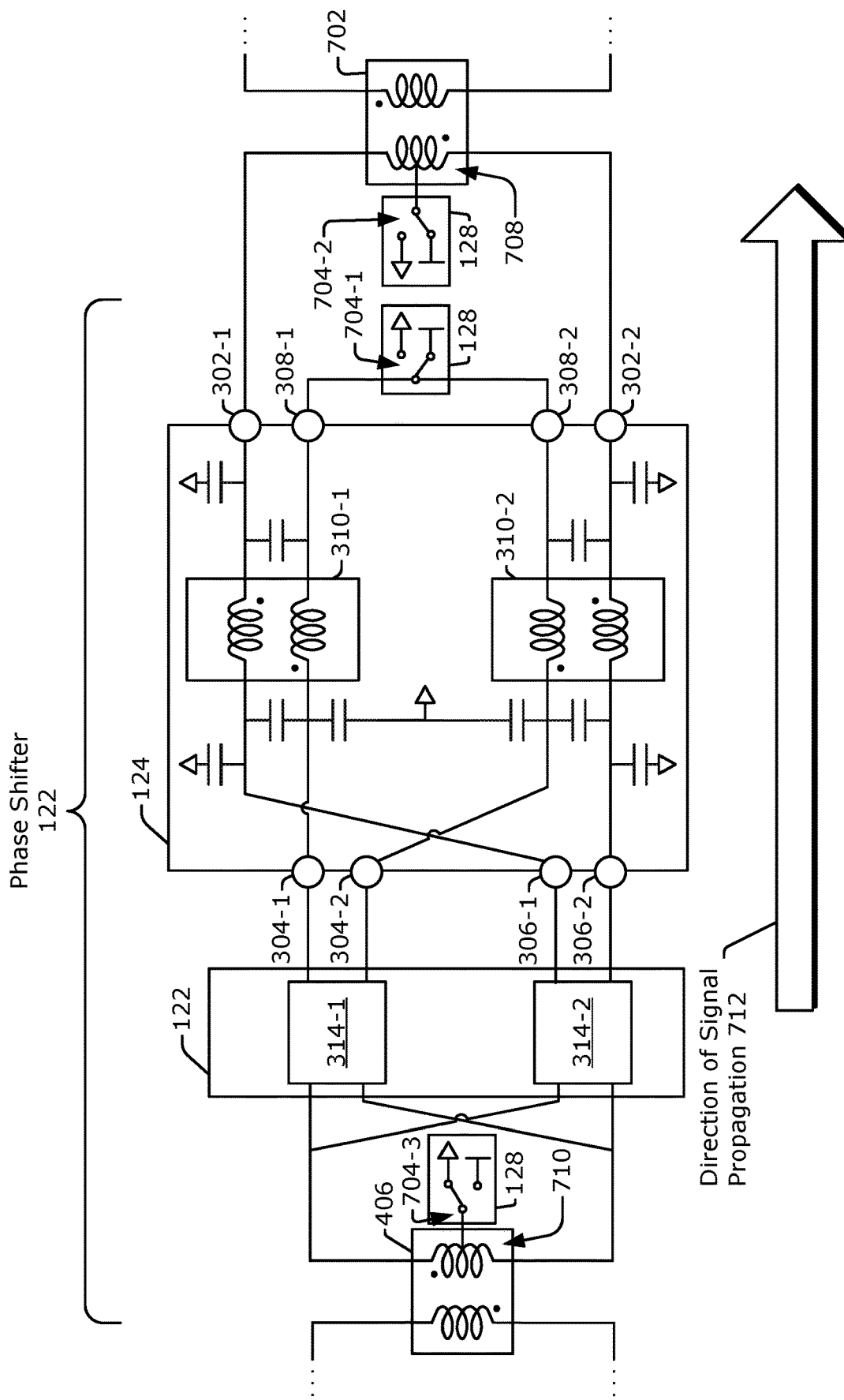

The coupling circuit 406 is connected to the second port 404 and the variable gain amplifiers 314-1 and 314-2. The coupling circuit 406 can be implemented as a transformer, as shown in FIGS. 7-1 to 7-3. Alternatively, the coupling circuit 406 can be implemented using a Wilkinson circuit (e.g., a Wilkinson combiner or splitter), a T-junction, a current summing node, a matching network, and so forth. The coupling circuit 406 operates as a combiner or a splitter depending on an operational mode of the wireless transceiver 120.

During a transmit operation, an input transmit signal 218 passes from the first port 402 of the phase shifter 122 to the shared port 302 of the asymmetrical quadrature hybrid coupler 124. The asymmetrical quadrature hybrid coupler 124 generates split transmit signals 408-1 and 408-2 at the through port 304 and the coupled port 306, respectively. The split transmit signals 408-1 and 408-2 are approximately ninety degrees out-of-phase with respect to each other and can have relatively similar amplitudes. The variable gain amplifiers 314-1 and 314-2 adjust amplitudes of the split transmit signals 408-1 and 408-2 to generate amplified split transmit signals 410-1 and 410-2. Amplitudes of the amplified split transmit signals 410-1 and 410-2 can be greater than, less than, or approximately equal to amplitudes of the corresponding split transmit signals 408-1 and 408-2 to facilitate phase shifting by the phase shifter 122. The coupling circuit 406 combines the amplified split transmit signals 410-1 and 410-2 to generate the phase-shifted transmit signal 220 at the second port 404. In this manner, a phase of the phase-shifted transmit signal 220 is based on a relative amplitude difference between the amplified split transmit signals 410-1 and 410-2 and the ninety-degree phase offset between the amplified split transmit signals 410-1 and 410-2 due to the asymmetrical quadrature hybrid coupler 124.

During a receive operation, the coupling circuit 406 splits the input receive signal 222 to generate split receive signals 412-1 and 412-2. The split receive signals 412-1 and 412-2 are substantially in-phase with each other (e.g., have relatively similar phases). The variable gain amplifiers 314-1 and 314-2 adjust amplitudes of the split receive signals 412-1 and 412-2 to generate amplified split receive signals 414-1 and 414-2. Similar to the amplified split transmit signals 410-1 and 410-2, amplitudes of the amplified split receive signals 414-1 and 414-2 can be greater than, less than, or approximately equal to amplitudes of the corresponding split receive signals 412-1 and 412-2, depending on a desired phase shift. The asymmetrical quadrature hybrid coupler 124 generates a phase-shifted receive signal 224 at the shared port 302 based on the amplified split receive signals 414-1 and 414-2. In this manner, a phase of the phase-shifted receive signal 224 is based on a relative amplitude difference between the amplified split receive signals 414-1 and 414-2 and a ninety-degree phase offset that is applied via the asymmetrical quadrature hybrid coupler 124 to one of the amplified split receive signals 414-1 or 414-2. As shown above, the phase shifter 122 performs phase shifting for both transmission and reception, and the phase shifter 122 is therefore bidirectional.

The phase shifter 122 depicted in FIG. 4 can represent a single-ended implementation or a differential implementation of the phase shifter 122. In the single-ended implementation, the asymmetrical quadrature hybrid coupler 124 can be implemented using a single transformer with a first inductor and a second inductor. The first inductor is connected between the shared port 302 and the coupled port 306. The second inductor is connected between the isolated port 308 and the through port 304. This is similar to transformer 310-1 depicted in FIG. 5. An example differential implementation of the asymmetrical quadrature hybrid coupler 124 is further described with respect to FIG. 5.

FIG. 5 illustrates an example differential implementation of an asymmetrical quadrature hybrid coupler 124. In the depicted configuration, the asymmetrical quadrature hybrid coupler 124 includes differential shared ports 302-1 and 302-2, differential through ports 304-1 and 304-2, differential coupled ports 306-1 and 306-2, and differential isolated ports 308-1 and 308-2. The bias circuitry 128 is directly connected to the differential isolated ports 308-1 and 308-2.

The asymmetrical quadrature hybrid coupler 124 also includes two transformers: a first transformer 310-1 and a second transformer 310-2. The first transformer 310-1 includes a first inductor 502-1 and a second inductor 502-2. The first inductor 502-1 is connected between a positive shared port 302-1 and a positive coupled port 306-1. The second inductor 502-2 is connected between a positive isolated port 308-1 and a positive through port 304-1. As shown in FIG. 5, the second inductor 502-2 is directly connected to the positive isolated port 308-1 such that an impedance termination is not present or connected between the inductor 502-2 and the positive isolated port 308-1.

Similarly, the second transformer 310-2 includes a first inductor 504-1 and a second inductor 504-2. The first inductor 504-1 is connected between a negative shared port 302-2 and a negative coupled port 306-2. The second inductor 504-2 is connected between a negative isolated port 308-2 and a negative through port 304-2. As shown in FIG. 5, the second inductor 504-2 is directly connected to the negative isolated port 308-2 such that an impedance termination is not present or connected between the inductor 504-2 and the negative isolated port 308-2. By directly connecting the inductors 502-2 and 504-2 to the differential isolated ports 308-1 and 308-2, the asymmetrical quadrature hybrid coupler 124 can provide a larger DC voltage to the vector modulator 126 relative to designs that include resistors between the differential isolated ports 308-1 and 308-2 and the inductors 502-2 and 504-2.

A first ratio of inductances of the inductors 502-1 and 502-2 is approximately equal to a second ratio of inductances of the inductors 504-1 and 504-2 (e.g., within approximately 15% or within approximately 10%). In some implementations, an inductance of the first inductor 502-1 is approximately equal to an inductance of the first inductor 504-1 (e.g., within approximately 15% or within approximately 10%). Additionally, the inductance of the inductor 502-2 is approximately equal to the inductance of the inductor 504-2 (e.g., within approximately 15% or within approximately 10%). In general, the inductances of the inductors 502-1 and 504-1 can be greater than or less than the inductances of the inductors 502-2 and 504-2 to compensate for the second inductors 502-2 and 504-2 being directly connected to the isolated ports 308-1 and 308-2, respectively. The difference between these inductances can be determined based on quality factors of the inductors 502-1, 502-2, 504-1, and 504-2, and based on capacitances of capacitors 312-1 to 312-10.

In the depicted configuration, the asymmetrical quadrature hybrid coupler 124 includes six capacitors 312-1, 312-2, 312-3, 312-4, 312-5, and 321-6 that are connected to a ground 506. The capacitors 312-1, 312-2, and 312-3 respectively connect the positive shared port 302-1, the positive coupled port 306-1, and the positive through port 304-1 to the ground 506. Similarly, the capacitors 312-4, 312-5, and 312-6 respectively connect the negative shared port 302-2, the negative coupled port 306-2, and the negative through port 304-2 to the ground 506.

In an alternative implementation not shown, the capacitors 312-1 to 312-6 are implemented using three capacitors that are not connected to the ground 506. For example, the capacitors 312-1 and 312-4 are replaced with a first capacitor (not shown), which is connected between the positive shared port 302-1 and the negative shared port 302-2. Similarly, the capacitors 312-2 and 312-5 are replaced with a second capacitor (not shown), which is connected between the positive coupled port 306-1 and the negative coupled port 306-2. Likewise, the capacitors 312-3 and 312-6 are replaced with a third capacitor (not shown), which is connected between the positive through port 304-1 and the negative through port 304-2.

The capacitors 312-7, 312-8, 312-9, and 312-10 respectively connect the positive shared port 302-1 to the positive isolated port 308-1, the positive coupled port 306-1 to the positive through port 304-1, the negative shared port 302-2 to the negative isolated port 308-2, and the negative coupled port 306-2 to the negative through port 304-2.

Together, inductances of the inductors 502-1 and 502-2, inductances of the inductors 504-1 and 504-2, capacitances of the capacitors 312-1 to 312-10, magnetic coupling coefficients of the transformers 310-1 and 310-2, interwinding capacitances of the transformers 310-1 and 310-2, and other parasitic capacitances within the asymmetrical quadrature hybrid coupler 124 enable the asymmetrical quadrature hybrid coupler 124 to achieve a target amplitude and phase balance (e.g., a target image rejection ratio). An example implementation of the variable gain amplifier 314-1 or 314-2 is further described with respect to FIG. 6.

Figure 6:
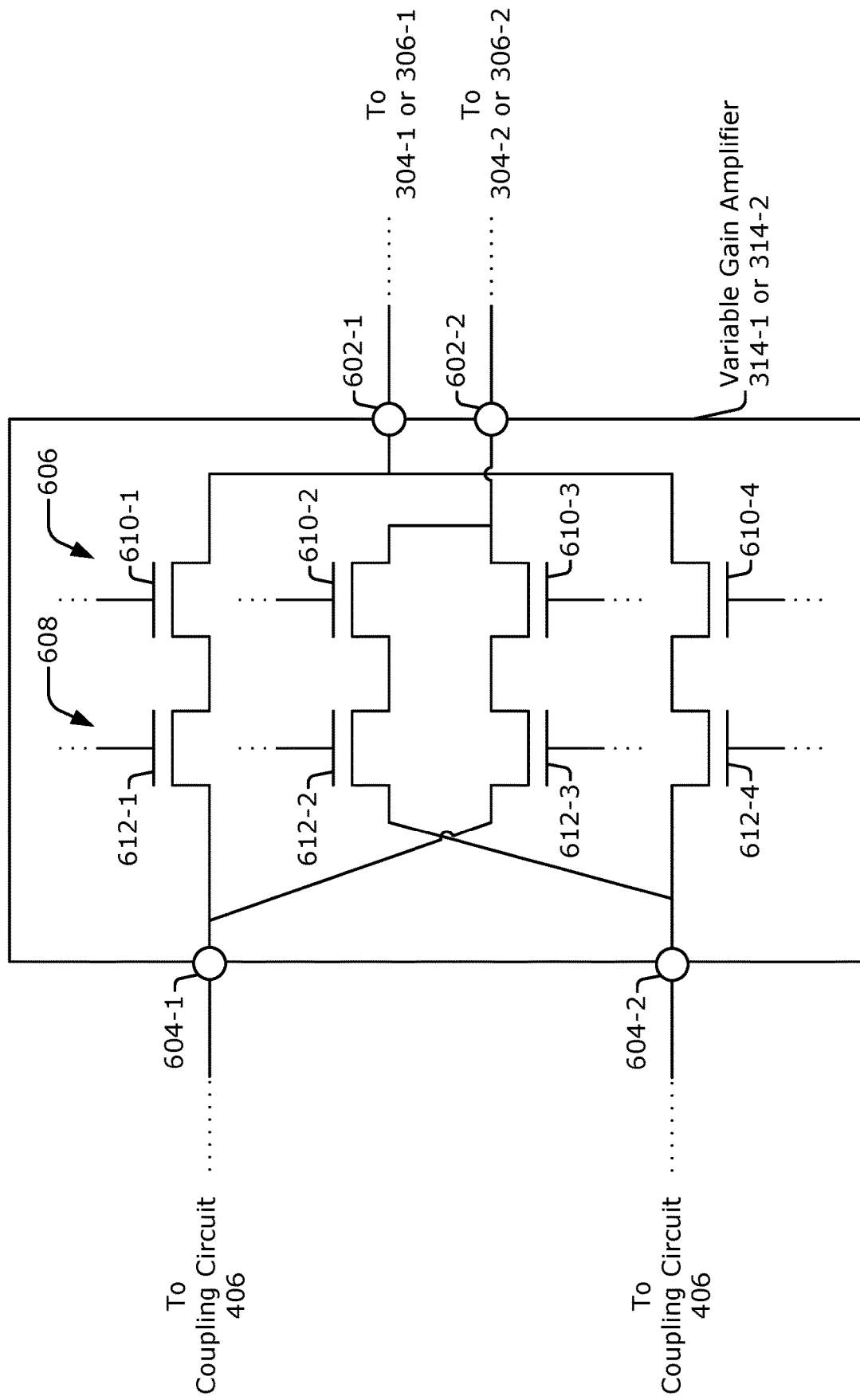
FIG. 6 illustrates an example implementation of a differential variable gain amplifier.

FIG. 6 illustrates an example implementation of a differential variable gain amplifier 314-1 or 314-2. In the depicted configuration, the differential variable gain amplifier 314-1 or 314-2 includes a first plus port 602-1, a first minus port 602-2, a second plus port 604-1, a second minus port 604-2, a first stage 606, and a second stage 608. The first ports 602-1 and 602-2 are respectively connected to the differential through ports 304-1 and 304-2 or the differential coupled ports 306-1 and 306-2 of the asymmetrical quadrature hybrid coupler 124. The second ports 604-1 and 604-2 are connected to the coupling circuit 406 of FIG. 4.

In this example, the first stage 606 and the second stage 608 are implemented using transistors that are in a common-gate configuration. The transistors can be implemented using n-channel metal-oxide-semiconductor field-effect transistors (NMOSFETs) or p-channel metal-oxide-semiconductor field-effect transistors (PMOSFETs). Due to the common-gate configuration, each transistor within the first stage 606 and the second stage 608 is symmetrical. As such, a current can flow from one channel terminal of the transistor to another channel terminal of the transistor, or vice versa, based on a DC voltage provided via the asymmetrical quadrature hybrid coupler 124. By using transistors that are in the common-gate configuration, the variable gain amplifiers are bidirectional. The first stage 606 and the second stage 608 can implement an input stage or a cascode stage of the variable gain amplifier 314-1 or 314-2 depending on the operational mode of the wireless transceiver 120.

The first stage 606 includes transistors 610-1, 610-2, 610-3, and 610-4. The second stage 608 includes transistors 612-1, 612-2, 612-3, and 612-4. The transistors 610-1 and 612-1 implement a first pair of transistors, which are connected together in series between the first port 602-1 and the second port 604-1. The transistors 610-2 and 612-2 implement a second pair of transistors, which are connected together in series between the first port 602-2 and the second port 604-2. Similarly, the transistors 610-3 and 612-3 implement a third pair of transistors, which are connected together in series between the first port 602-2 and the second port 604-1. The transistors 610-4 and 612-4 implement a fourth pair of transistors, which are connected together in series between the first port 602-1 and the second port 604-2. Although not shown, gates of the transistors 610-1 to 610-4 and gates of the transistors 612-1 to 612-4 can be connected to the bias circuitry 128 or a voltage generator, which can provide individual bias voltages. During operation, the bias circuitry 128 can enable different pairs of the transistors to increase, decrease, or invert an amplitude of a signal that propagates between the first ports 602-1 and 602-2 and the second ports 604-1 and 604-2.

In some implementations, the depicted stages 606 and 608 represent a single amplification portion (or slice) of the variable gain amplifier 314-1 or 314-2. In this case, the variable gain amplifier 314-1 or 314-2 can include multiple amplification portions that are implemented together in parallel. For instance, an amplification portion can be implemented for each bit of a total number of bits at a given resolution level (e.g., five amplification portions for a 5-bit resolution for the phase shifter 122). Each amplification portion can correspond to a different amplification factor, and each portion can be separately activated based on the configuration signal 216 from the control circuitry 130. The amplification portions can be weighted to provide different total amplifications or gains. Example amplification weighting schemes include binary weighting, logarithmic weighting, temperature coding, and so forth. A four-bit control technique can be realized with, for example, 1×, 2×, 4×, and 8× amplification factors for four respective amplification portions. In some cases, the different amplification factors are realized using different quantities of transistors or different sizes of transistors.

FIG. 7-1 illustrates example bias circuitry 128 that enables bidirectional operation of the asymmetrical quadrature hybrid coupler 124. In the depicted configuration, the phase shifter 122 is connected to a transformer 702. In particular, the differential shared ports 302-1 and 302-2 of the asymmetrical quadrature hybrid coupler 124 are connected to an inductor 708 of a transformer 702. The inductor 708 is also connected to the bias circuitry 128. As an example, the bias circuitry 128 is connected to a center tap on the inductor 708. Although not shown, a center tap of another inductor of the transformer 702 can be connected to another bias voltage provided by the bias circuitry 128 or a voltage generator (not shown). In an alternative implementation, the transformer 702 can be replaced with another type of coupling circuit, such as a Wilkinson circuit (e.g., a Wilkinson combiner or splitter), a T-junction, a current summing node, a matching network, and so forth.

In this example, the coupling circuit 406 is implemented using a transformer. An inductor 710 of the coupling circuit 406 is connected to the variable gain amplifiers 314-1 and 314-2. Additionally, the bias circuitry 128 is connected to a center tap on the inductor 710. Although not shown, a center tap of another inductor of the coupling circuit 406 can be connected to another bias voltage provided by the bias circuitry 128 or the voltage generator.

To support bidirectional operation of the phase shifter 122, the bias circuitry 128 includes at least one switch 704, which includes a single throw and two poles. The two poles are respectively connected to the ground 506 and a supply voltage 706. An impedance of the switch 704 can be relatively small (e.g., less than approximately 10 ohms or approximately zero ohms). The configuration signal 214 provided by the control circuitry 130 (not shown) controls whether the switch 704 connects the pole to the ground 506 or the supply voltage 706. The bias circuitry 128 can include three separate switches 704 with poles respectively connected to the differential isolated ports 308-1 and 308-2, the inductor 708 of the transformer 702, and the inductor 710 of the coupling circuit 406, as further shown in FIGS. 7-2 and 7-3.

FIG. 7-2 illustrates a first configuration of bias circuitry 128 for propagating a signal for transmission. In the depicted configuration, the bias circuitry includes three switches 704-1, 704-2, and 704-3. A pole of the switch 704-1 is connected to the differential isolated ports 308-1 and 308-2. A pole of the switch 704-2 is connected to a center tap of an inductor of the transformer 702. Similarly, a pole of the switch 704-3 is connected to a center tap of an inductor of the coupling circuit 406.

During a transmit operation, the switch 704-2 connects the inductor 708 of the transformer 702 to the ground 506. Similarly, the switch 704-1 connects the differential isolated ports 308-1 and 308-2 to the ground 506. The switch 704-3 connects the inductor 710 of the coupling circuit 406 to the supply voltage 706. Based on this configuration, a signal propagates from the transformer 702 to the coupling circuit 406, as shown by an arrow at the bottom of FIG. 7-2. The arrow represents a direction of signal propagation 712. A different configuration of the bias circuitry 128 for a receive operation is further described with respect to FIG. 7-3.

FIG. 7-3 illustrates a second configuration of bias circuitry for propagating a signal for reception. During a receive operation, the switch 704-2 connects the inductor 708 of the transformer 702 to the supply voltage 706. The switch 704-1 connects the differential isolated ports 308-1 and 308-2 to the supply voltage 706. The switch 704-3 connects the inductor 710 of the coupling circuit 406 to the ground 506. Based on this configuration, a signal propagates from the coupling circuit 406 to the transformer 702, as shown by an arrow at the bottom of FIG. 7-3. The arrow represents the direction of signal propagation 712.

In FIGS. 7-2 and 7-3, the depicted direction of signal propagation 712 assumes that the variable gain amplifiers 314-1 and 314-2 are implemented using NMOSFETs. However, if the variable gain amplifiers 314-1 and 314-2 are implemented using PMOSFETs, the direction of signal propagation 712 shown in FIGS. 7-2 and 7-3 is reversed. For example, the first configuration of the bias circuitry 128 depicted in FIG. 7-2 enables a signal to propagate from left to right for reception. Similarly, the second configuration of the bias circuitry 128 depicted in FIG. 7-3 enables a signal to propagate from right to left for transmission.

Figure 8:
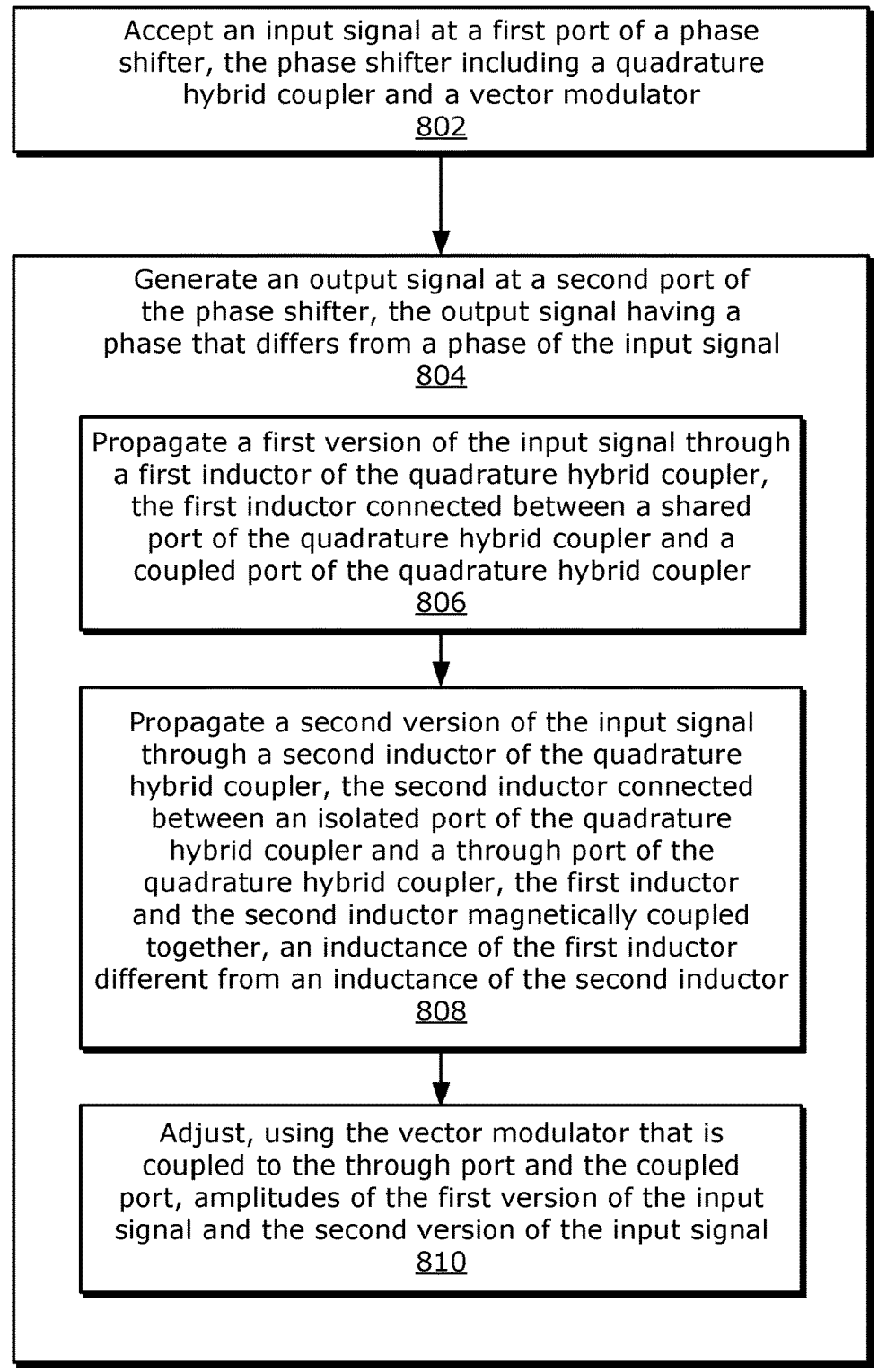
FIG. 8 is a flow diagram illustrating an example process for operating an asymmetrical quadrature hybrid coupler.

FIG. 8 is a flow diagram illustrating an example process for operating an asymmetrical quadrature hybrid coupler 124. The process 800 is described in the form of a set of blocks 802-810 that specify operations that can be performed. However, operations are not necessarily limited to the order shown in FIG. 8 or described herein, for the operations may be implemented in alternative orders or in fully or partially overlapping manners. Operations represented by the illustrated blocks of the process 800 may be performed by the wireless transceiver 120 (e.g., of FIG. 1 or 2) or a phase shifter 122 (e.g., of FIG. 2 or 4). More specifically, the operations of the process 800 may be performed, at least partially, by an asymmetrical quadrature hybrid coupler 124 as shown in FIGS. 3 and 5.

At block 802, an input signal is accepted at a first port of a phase shifter. The phase shifter includes a quadrature hybrid coupler and a vector modulator. As an example, the phase shifter 122 accepts the input transmit signal 218 at the first port 402 of FIG. 4. As another example, the phase shifter 122 accepts the input receive signal 222 at the second port 404. The phase shifter 122 includes the asymmetrical quadrature hybrid coupler 124 and the vector modulator 126, as shown in FIGS. 1, 2, and 4.

At block 804, an output signal is generated at a second port of the phase shifter. The output signal has a phase that differs from a phase of the input signal. Assuming the phase shifter 122 accepts the input transmit signal 218 at the first port 402, the phase shifter 122 generates the phase-shifted transmit signal 220 at the second port 404, as shown in FIG. 4. Alternatively, the phase shifter 122 generates the phase-shifted receive signal 224 at the first port 402 if the phase shifter 122 accepts the input receive signal 222 at the second port 404, as shown in FIG. 4. The generating of the output signal comprises the steps described at blocks 806-810.

At block 806, a first version of the input signal propagates through a first inductor of the quadrature hybrid coupler. The first inductor is connected between a shared port of the quadrature hybrid coupler and a coupled port of the quadrature hybrid coupler. For example, a first version of the input transmit signal 218 or one of the amplified split receive signals 414-1 and 414-2 propagates through a first inductor of the transformer 310 (e.g., transformation means) of the asymmetrical quadrature hybrid coupler 124. The first inductor is connected between the shared port 302 and the coupled port 306.

At block 808, a second version of the input signal propagates through a second inductor of the quadrature hybrid coupler. The second inductor is connected between an isolated port of the quadrature hybrid coupler and a through port of the quadrature hybrid coupler. The second inductor is directly connected to the isolated port. The first inductor and the second inductor, which together represent inductance means, are magnetically coupled together. An inductance of the first inductor is different from an inductance of the second inductor.

For example, a second version of the input transmit signal 218 or another one of the amplified split receive signals 414-1 and 414-2 propagates through a second inductor of the transformer 310. The second inductor is connected between the isolated port 308 and the through port 304. The second inductor is directly connected to the isolated port 308. The first inductor and the second inductor are magnetically coupled together. An inductance of the first inductor is different from an inductance of the second inductor. For instance, the inductance of the first inductor is greater than the inductance of the second inductor to compensate for the direct connection between the second inductor and the isolated port 308.

At block 810, amplitudes of the first version of the input signal and the second version of the input signal are adjusted using the vector modulator, which is coupled to the through port and the coupled port. For example, the vector modulator 126 adjusts amplitudes of the split transmit signals 408-1 and 408-2 or the split receive signals 412-1 and 412-2, as shown in FIG. 4. The vector modulator 126 is connected to the through port 304 and the coupled port 306, as shown in FIG. 4.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
an quadrature hybrid coupler comprising:
   a shared port;
   a through port;
   a coupled port;
   an isolated port; and
   at least one transformer comprising:
      a first inductor connected between the shared port and the coupled port; and
      a second inductor connected between the isolated port and the through port, the second inductor directly connected to the isolated port, an inductance of the first inductor different from an inductance of the second inductor.

2. The apparatus of claim 1, wherein:
the inductance of the first inductor is greater than the inductance of the second inductor.

3. The apparatus of claim 1, wherein:
an impedance between the second inductor and the isolated port is less than approximately ten ohms.

4. The apparatus of claim 3, wherein:
the impedance between the second inductor and the isolated port is approximately equal to zero ohms.

5. The apparatus of claim 1, wherein:
the shared port comprises differential shared ports, the differential shared ports comprising a positive shared port and a negative shared port;
the through port comprises differential through ports, the differential through ports comprising a positive through port and a negative through port;
the coupled port comprises differential coupled ports, the differential coupled ports comprising a positive coupled port and a negative coupled port;
the isolated port comprises differential isolated ports, the differential isolated ports comprising a positive isolated port and a negative isolated port, the differential isolated ports connected together;
the at least one transformer comprises a first transformer;
the first inductor of the first transformer is connected between the positive shared port and the positive coupled port;
the second inductor of the first transformer is connected between the positive isolated port and the positive through port;
the second inductor of the first transformer is directly connected to the positive isolated port; and
the quadrature hybrid coupler comprises a second transformer, the second transformer comprising:
   a first inductor connected between the negative shared port and the negative coupled port; and
   a second inductor connected between the negative isolated port and the negative through port, the second inductor of the second transformer directly connected to the negative isolated port, an inductance of the first inductor of the second transformer different from an inductance of the second inductor of the second transformer.

6. The apparatus of claim 5, wherein:
a first ratio of the inductance of the first inductor of the first transformer and the inductance of the second inductor of the first transformer is greater than one;
a second ratio of the inductance of the first inductor of the second transformer and the inductance of the second inductor of the second transformer is greater than one; and
the first ratio is approximately equal to the second ratio.

7. The apparatus of claim 1, further comprising:
bias circuitry connected to the isolated port, the bias circuitry configured to connect the isolated port to a ground.

8. The apparatus of claim 7, wherein the quadrature hybrid coupler is configured to:
accept an input signal at the shared port;
generate, based on the input signal, an in-phase signal at the through port; and
generate, based on the input signal, a quadrature signal at the coupled port.

9. The apparatus of claim 1, further comprising:
bias circuitry connected to the isolated port, the bias circuitry configured to connect the isolated port to a supply voltage.

10. The apparatus of claim 9, wherein the quadrature hybrid coupler is configured to:
accept a first split signal at the through port;
accept a second split signal at the coupled port; and
generate, based on both the first split signal and the second split signal, an output signal at the shared port.

11. The apparatus of claim 1, further comprising:
a phase shifter comprising:
the quadrature hybrid coupler; and
a vector modulator connected to the quadrature hybrid coupler, the vector modulator comprising:
a first variable gain amplifier directly connected to the through port; and
a second variable gain amplifier directly connected to the coupled port.

12. The apparatus of claim 11, wherein:
the first variable gain amplifier comprises a first transconductance amplifier;
the second variable gain amplifier comprises a second transconductance amplifier; and
the quadrature hybrid coupler is configured to provide respective direct-current (DC) voltages to the first transconductance amplifier and the second transconductance amplifier.

13. The apparatus of claim 12, wherein:
the first transconductance amplifier comprises at least one transistor implemented in a common-gate configuration, a channel terminal of the at least one transistor connected to the through port; and
the second transconductance amplifier comprises at least one other transistor implemented in the common-gate configuration, a channel terminal of the at least one other transistor connected to the coupled port.

14. The apparatus of claim 11, wherein:
the first variable gain amplifier has an impedance seen from the through port, the impedance is approximately equal to fifty ohms; and
the second variable gain amplifier has another impedance seen from the coupled port, the other impedance approximately equal to fifty ohms.

15. The apparatus of claim 11, further comprising:
a wireless transceiver comprising:
a first transformer;
the phase shifter connected to the first transformer, the phase shifter comprising a second transformer; and
bias circuitry connected to the isolated port, an inductor of the first transformer, and an inductor of the second transformer, wherein:
the wireless transceiver is configured to selectively:
operate in a first configuration; or
operate in a second configuration; and
the bias circuitry is configured to selectively:

based on the first configuration:
connect the inductor of the first transformer to a ground;
connect the isolated port to the ground; and
connect the inductor of the second transformer to a supply voltage; or
based on the second configuration:
connect the inductor of the first transformer to the supply voltage;
connect the isolated port to the supply voltage; and
connect the inductor of the second transformer to the ground.

16. The apparatus of claim 15, further comprising:
a display screen; and
a processor operatively coupled to the display screen and the wireless transceiver, the processor configured to present one or more graphical images on the display screen based on signals communicated by the wireless transceiver using the phase shifter.

17. An apparatus comprising:
an quadrature hybrid coupler comprising:
a shared port;
a through port;
a coupled port;
an isolated port;
transformation means for coupling the shared port, the through port, the coupled port, and the isolated port together, the transformation means comprising:
inductance means for providing a first inductance between the shared port and the coupled port and providing a second inductance between the isolated port and the through port, the first inductance different from the second inductance; and
means for directly connecting the inductance means to the isolated port.

18. The apparatus of claim 17, wherein the first inductance is greater than the second inductance.

19. The apparatus of claim 17, further comprising bias circuitry configured to selectively:
connect the isolated port to a ground; or
connect the isolated port to a supply voltage.

20. The apparatus of claim 17, further comprising:
a phase shifter comprising:
the quadrature hybrid coupler; and
a first variable gain amplifier directly connected to the through port; and
a second variable gain amplifier directly connected to the coupled port,
wherein the transformation means is configured to provide respective direct-current (DC) voltages to the first variable gain amplifier and the second variable gain amplifier.

21. The apparatus of claim 20, wherein the transformation means is configured to provide impedance matching to both the first variable gain amplifier and the second variable gain amplifier.

22. A method comprising:
accepting an input signal at a first port of a phase shifter, the phase shifter including an quadrature hybrid coupler and a vector modulator; and
generating an output signal at a second port of the phase shifter, the output signal having a phase that differs from a phase of the input signal, the generating of the output signal comprising:
propagating a first version of the input signal through a first inductor of the quadrature hybrid coupler, the first inductor connected between a shared port of the quadrature hybrid coupler and a coupled port of the quadrature hybrid coupler;

propagating a second version of the input signal through a second inductor of the quadrature hybrid coupler, the second inductor connected between an isolated port of the quadrature hybrid coupler and a through port of the quadrature hybrid coupler, the second inductor directly connected to the isolated port, the first inductor and the second inductor magnetically coupled together, an inductance of the first inductor different from an inductance of the second inductor; and adjusting, using the vector modulator that is coupled to the through port and the coupled port, amplitudes of the first version of the input signal and the second version of the input signal.

23. The method of claim 22, further comprising:
passing the input signal from the first port of the phase shifter to the shared port of the quadrature hybrid coupler, the shared port connected to the first port, wherein:
the isolated port is connected to a ground;
the propagating of the first version of the input signal comprises generating, based on the input signal, a quadrature signal at the coupled port of the quadrature hybrid coupler; and
the propagating of the second version of the input signal comprises generating, based on the input signal, an in-phase signal at the through port of the quadrature hybrid coupler.

24. The method of claim 22, further comprising:
splitting the input signal to generate the first version of the input signal and the second version of the input signal, wherein:
the isolated port is connected to a supply voltage; and
the propagating of the first version of the input signal and the propagating of the second version of the input signal comprises generating, based on both the first version of the input signal and the second version of the input signal, the output signal at the shared port of the quadrature hybrid coupler, the shared port connected to the second port of the phase shifter.

25. An apparatus comprising:
a phase shifter comprising:
a vector modulator comprising:
a first variable gain amplifier; and
a second variable gain amplifier; and
an quadrature hybrid coupler comprising:
a through port directly connected to the first variable gain amplifier; and
a coupled port directly connected to the second variable gain amplifier.

26. The apparatus of claim 25, wherein the quadrature hybrid coupler comprises:
a shared port;
an isolated port; and
at least one transformer comprising:
a first inductor connected between the shared port and the coupled port; and
a second inductor connected between the isolated port and the through port, the second inductor directly connected to the isolated port, an inductance of the first inductor different from an inductance of the second inductor.

27. The apparatus of claim 26, wherein:
the inductance of the first inductor is greater than the inductance of the second inductor.

28. The apparatus of claim 26, further comprising:
bias circuitry connected to the isolated port, the bias circuitry configured to selectively connect the isolated port to a ground or a supply voltage, wherein:
the first variable gain amplifier comprises a first bidirectional variable gain amplifier; and
the second variable gain amplifier comprises a second bidirectional variable gain amplifier.

29. The apparatus of claim 25, wherein the quadrature hybrid coupler is configured to provide respective direct-current (DC) voltages to the first variable gain amplifier and the second variable gain amplifier.

30. The apparatus of claim 25, wherein the quadrature hybrid coupler is configured to provide impedance matching to the first variable gain amplifier and the second variable gain amplifier.

* * * * *